(12) United States Patent
Pickard

(10) Patent No.: US 9,030,103 B2
(45) Date of Patent: May 12, 2015

(54) SOLID STATE LIGHT EMITTING DEVICES INCLUDING ADJUSTABLE SCOTOPIC / PHOTOPIC RATIO

(71) Applicant: Cree, Inc., Durham, NC (US)

(72) Inventor: Paul Kenneth Pickard, Morrisville, NC (US)

(73) Assignee: Cree, Inc., Durham, NC (US)

( * ) Notice: Subject to any disclaimer, the term of this patent is extended or adjusted under 35 U.S.C. 154(b) by 80 days.

(21) Appl. No.: 13/763,576

(22) Filed: Feb. 8, 2013

(65) Prior Publication Data

US 2014/0225514 A1    Aug. 14, 2014

(51) Int. Cl.
*H05B 37/02* (2006.01)
*H05B 33/08* (2006.01)

(52) U.S. Cl.
CPC .................................. *H05B 33/0857* (2013.01)

(58) Field of Classification Search
CPC ........................................................ F21K 9/00
USPC ......................................................... 315/152
See application file for complete search history.

(56) References Cited

U.S. PATENT DOCUMENTS

| | | | |
|---|---|---|---|
| 5,015,924 A * | 5/1991 | Berman et al. | 315/324 |
| 5,803,579 A | 9/1998 | Turnbull et al. | |
| 6,817,735 B2 * | 11/2004 | Shimizu et al. | 362/231 |
| 7,008,078 B2 * | 3/2006 | Shimizu et al. | 362/231 |
| 7,015,636 B2 | 3/2006 | Bolta | |
| 7,234,844 B2 | 6/2007 | Bolta et al. | |
| 7,568,816 B2 | 8/2009 | Brass et al. | |
| 7,579,662 B2 | 8/2009 | Tanaka | |
| 7,679,281 B2 | 3/2010 | Kim et al. | |
| 7,901,107 B2 | 3/2011 | Van De Ven et al. | |
| 7,906,789 B2 | 3/2011 | Jung et al. | |
| 7,909,479 B2 | 3/2011 | Rooymans | |

(Continued)

FOREIGN PATENT DOCUMENTS

| | | |
|---|---|---|
| DE | 10233050 A1 | 2/2004 |
| EP | 2489717 A1 | 8/2012 |

(Continued)

OTHER PUBLICATIONS

"Boeing lighting project may help astronauts sleep," The Philadelphia Inquirer. (Jul. 29, 2012) Retreived from http://heraldnet.com/article/20120729/NEWS02/707299898/0/SEARCH.

(Continued)

*Primary Examiner* — Douglas W Owens
*Assistant Examiner* — Srinivas Sathiraju
(74) *Attorney, Agent, or Firm* — Withrow & Terranova, P.L.L.C.; Vincent K. Gustafson

(57) ABSTRACT

Solid state light emitting devices include multiple LED components separately arranged to generate spectral output having different ratios of scotopic to photopic light (S/P ratios) but similar chromaticities preferably within seven MacAdam ellipses. A light emitting device may be controlled to permit transitioning between different modes of operation of multiple LED components, with aggregated output of different modes having different S/P ratios but similar chromaticities. Multiple LED components of a light emitting device may be simultaneously controlled with different dimming profiles to effect increased color rendering at maximum emissive output of the apparatus, and to effect increased aggregated S/P ratio at minimum emissive output of the device.

46 Claims, 15 Drawing Sheets

(56) References Cited

U.S. PATENT DOCUMENTS

| | | | |
|---|---|---|---|
| 8,264,138 B2 | 9/2012 | Negley et al. | |
| 8,643,038 B2 | 2/2014 | Collins et al. | |
| 8,684,559 B2* | 4/2014 | Van De Ven et al. | 362/293 |
| 2006/0149607 A1 | 7/2006 | Sayers et al. | |
| 2007/0075629 A1 | 4/2007 | Le Toquin et al. | |
| 2007/0152797 A1 | 7/2007 | Chemel et al. | |
| 2009/0046453 A1 | 2/2009 | Kramer | |
| 2009/0303694 A1 | 12/2009 | Roth et al. | |
| 2009/0316393 A1 | 12/2009 | Vissenberg et al. | |
| 2010/0079059 A1 | 4/2010 | Roberts et al. | |
| 2010/0174345 A1 | 7/2010 | Ashdown | |
| 2010/0220471 A1 | 9/2010 | Rooymans | |
| 2010/0244740 A1 | 9/2010 | Alpert et al. | |
| 2010/0264432 A1* | 10/2010 | Liu et al. | 257/89 |
| 2011/0182065 A1* | 7/2011 | Negley et al. | 362/231 |
| 2011/0221330 A1 | 9/2011 | Negley et al. | |
| 2012/0008326 A1 | 1/2012 | Jou | |
| 2012/0206050 A1* | 8/2012 | Spero | 315/152 |
| 2012/0306382 A1* | 12/2012 | Maxik et al. | 315/152 |
| 2013/0296976 A1 | 11/2013 | Maxik et al. | |
| 2014/0001972 A1* | 1/2014 | Harris et al. | 315/200 R |

FOREIGN PATENT DOCUMENTS

| | | | |
|---|---|---|---|
| JP | 2000-022221 A | 1/2000 | |
| JP | 2001060450 A | 3/2001 | |
| JP | 2004-071726 A | 3/2004 | |
| JP | 2004-080046 A | 3/2004 | |
| JP | 2005-005482 A | 1/2005 | |
| JP | 2006-245443 A | 9/2006 | |
| JP | 2006-261702 A | 9/2006 | |
| JP | 2007173557 A | 7/2007 | |
| JP | 2007-258620 A | 10/2007 | |
| JP | 2007-266579 A | 10/2007 | |
| KR | 1020110135218 A | 12/2011 | |
| WO | WO 2006/132533 A2 | 12/2006 | |
| WO | WO 2008/053012 A1 | 5/2008 | |

OTHER PUBLICATIONS

"What is Induction Lighting?" MHT Lighting (accessed Feb. 27, 2013) http://www.mhtlighting.com/resources/induction-education/.

"White Paper: Better Vision with LED lights: Scotopic and Photopic Lumens", My LED Lighting Guide. 8 pages. (2008-2011).

Allen, M. and Dobson, J., "Spectrally Enhanced Lighting," 2011 USACE Infrastructure Systems Conference. Jun. 15, 2011.

Dilaura, D. "Photopic and Scotopic Lumens-1: An Introduction," Visual-3d, 2 pages, (accessed Feb. 27, 2013) http://www.visual-3d.com/Education/LightingLessons/Documents/PhotopicScotopicLumens_1.pdf.

Josefowicz, J. and Ha, D. "Vision & Exterior Lighting: Shining Some Light on Scotopic & Photopic Lumens in Roadway Conditions," LED Roadway Lighting Ltd. 12 pages (2009).

Nizamoglu et al., "High scotopic/photopic ratio white-light-emitting diodes integrated with semiconductor nanophosphors of colloidal quantum dots," Optics Letters vol. 36 No. 10 pp. 1893-1895 (2011).

Nizamoglu et al., "White light generation using CdSe/ZnS core—shell nanocrystals hybridized with InGaN/GaN ligh emitting diodes", Nanotechnology vol. 18 No. 6, pp. 1-5 (2007).

Rea et al., "Circadian light," Journal of Circadian Rhythms vol. 8 No. 2, 10 pages (2010).

Thapan et al., "An action spectrum for melatonin supression: evidence for a novel non-rod, non-cone photoreceptor system in humans," Journal of Physiology vol. 535 No. 1 pp. 261-267 (2001).

International Search Report and Written Opinion for PCT/US2014/014156 mailed May 19, 2014, 13 pages.

* cited by examiner

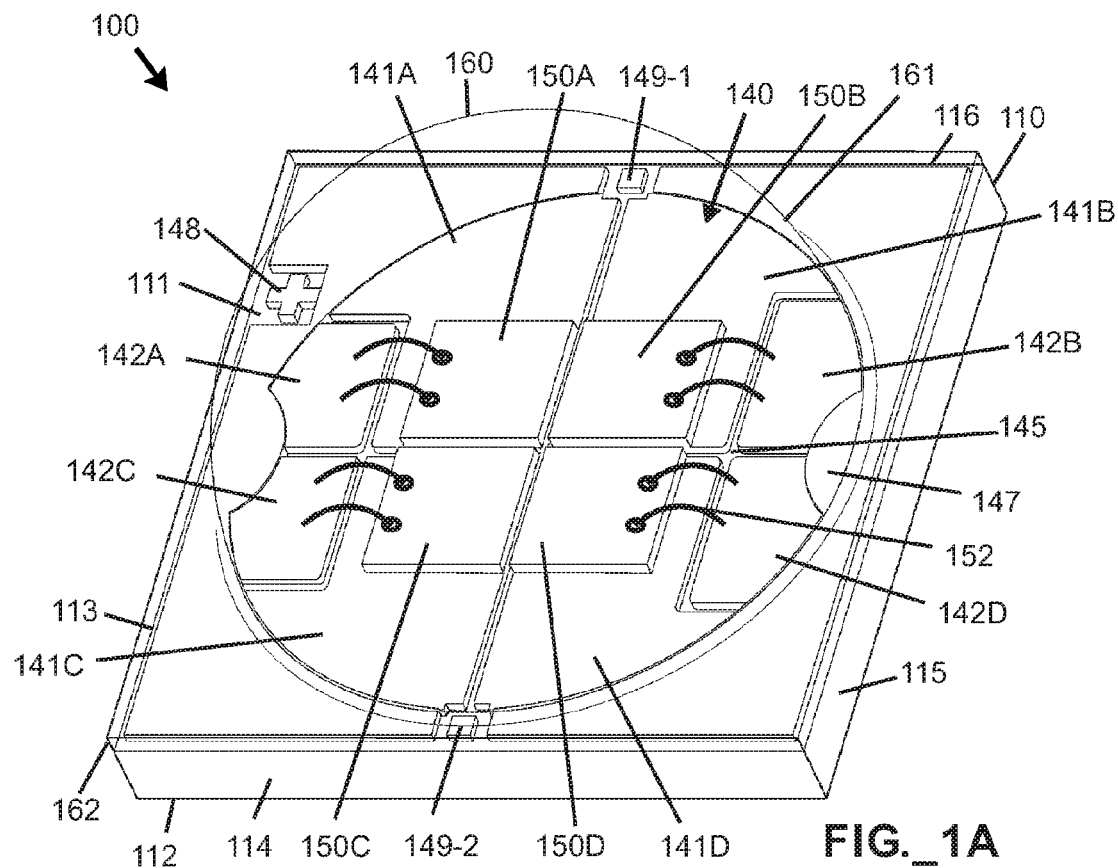
FIG._1A
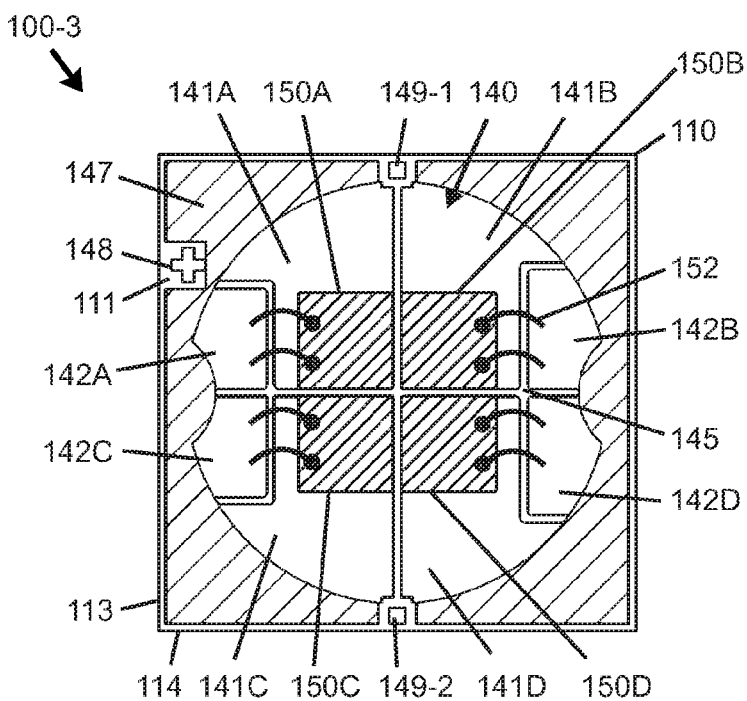
FIG._1B

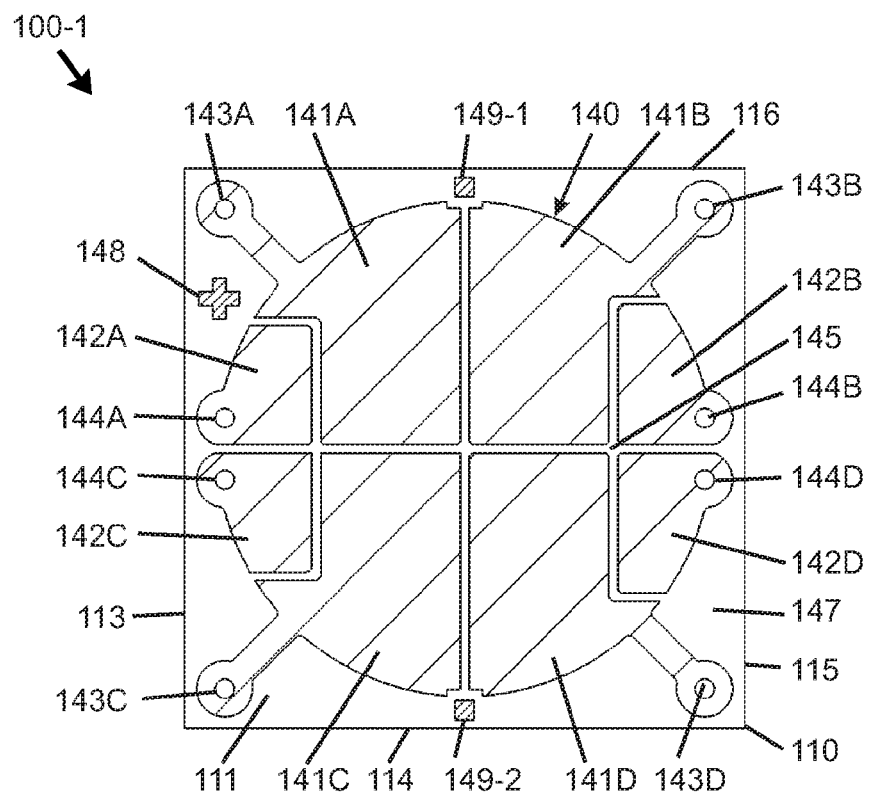
FIG._1C
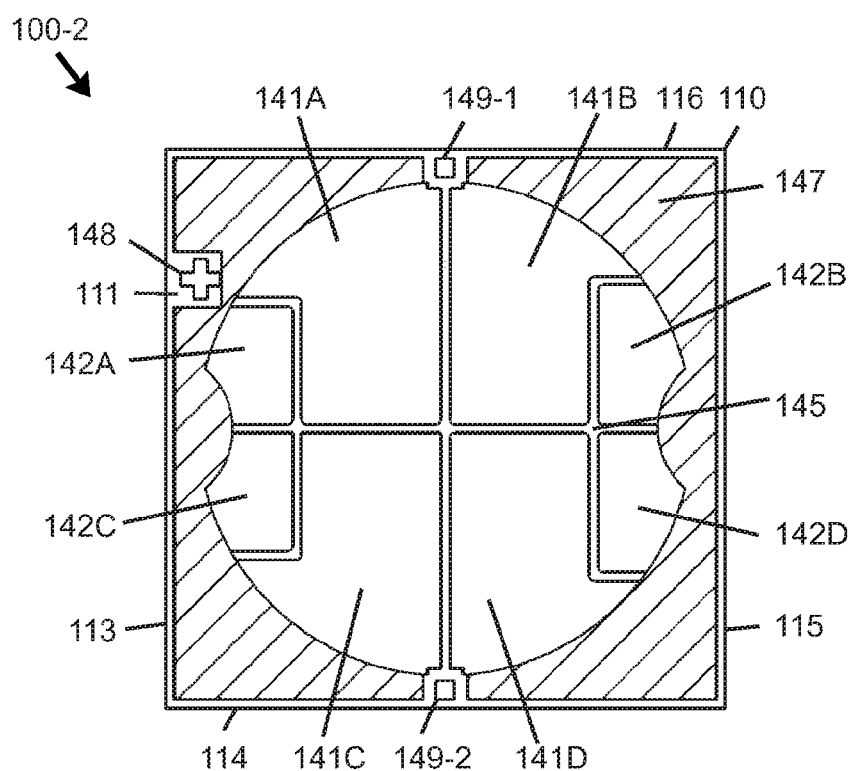
FIG._1D

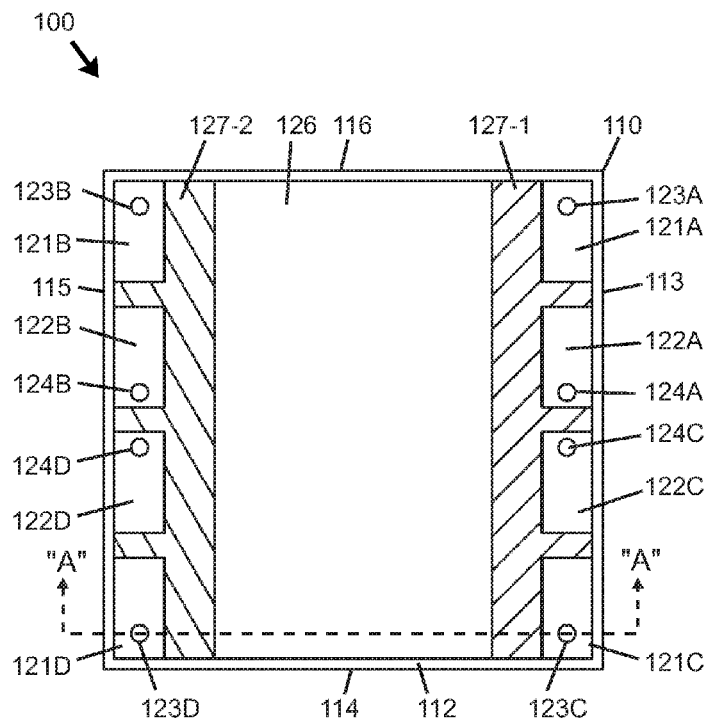
FIG._1E
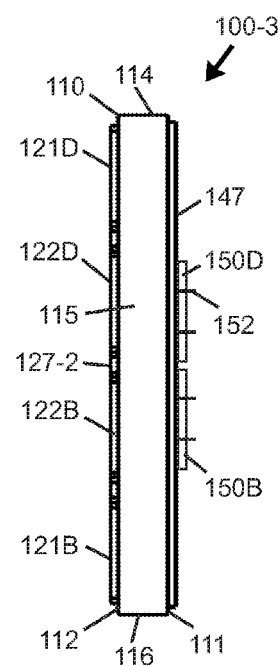
FIG._1F
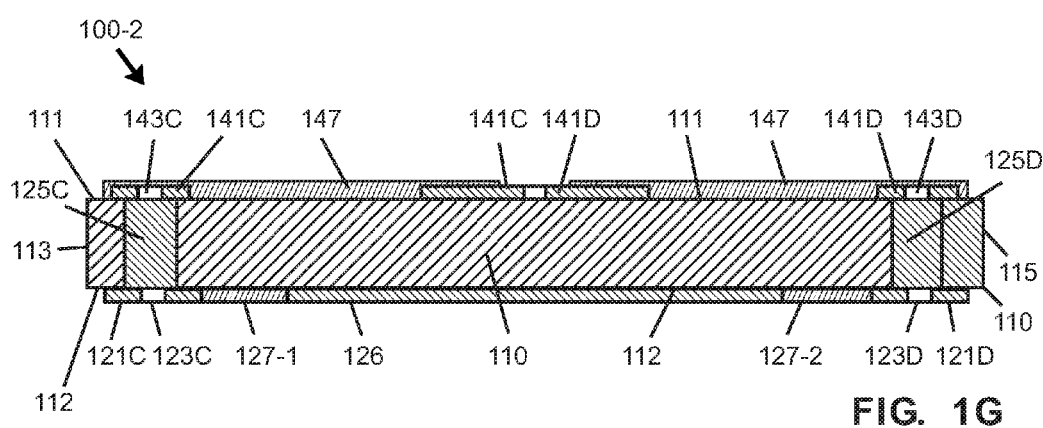
FIG._1G

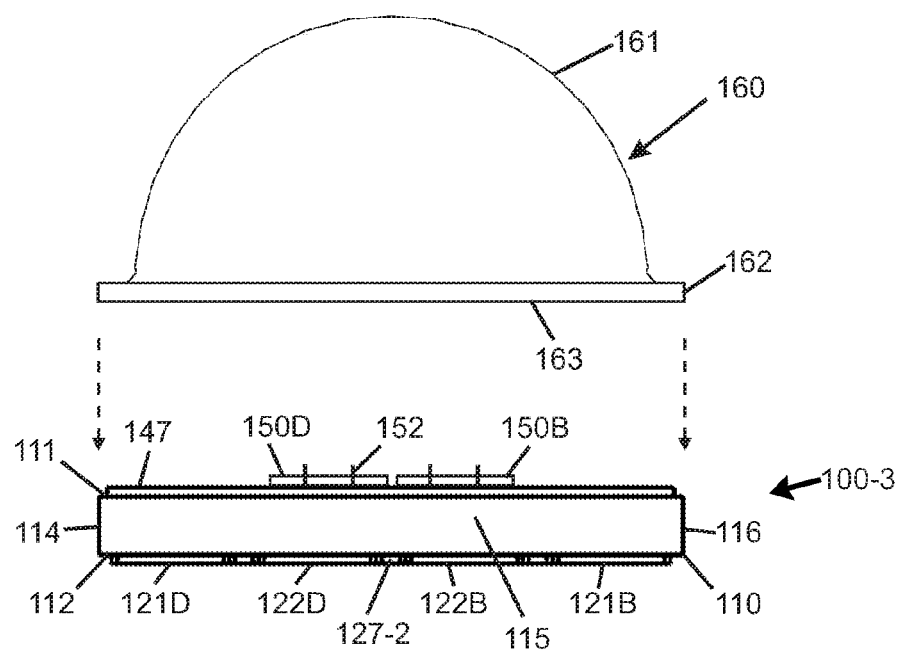
FIG._1H
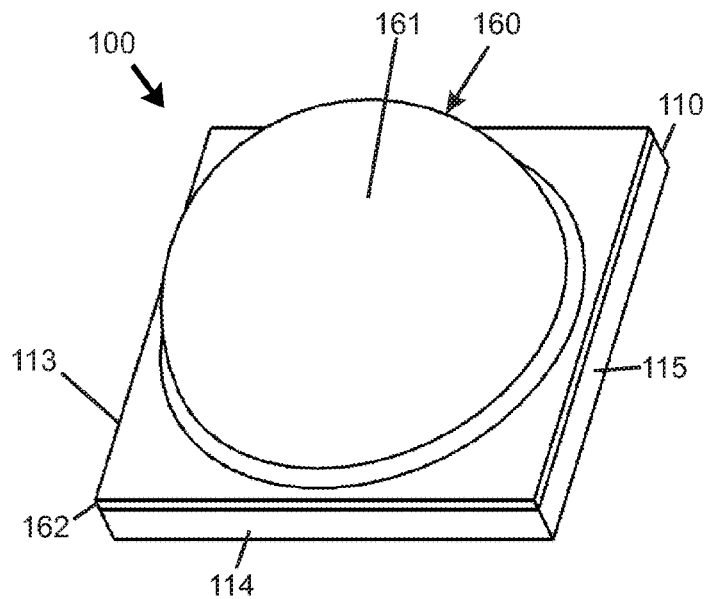
FIG._1I

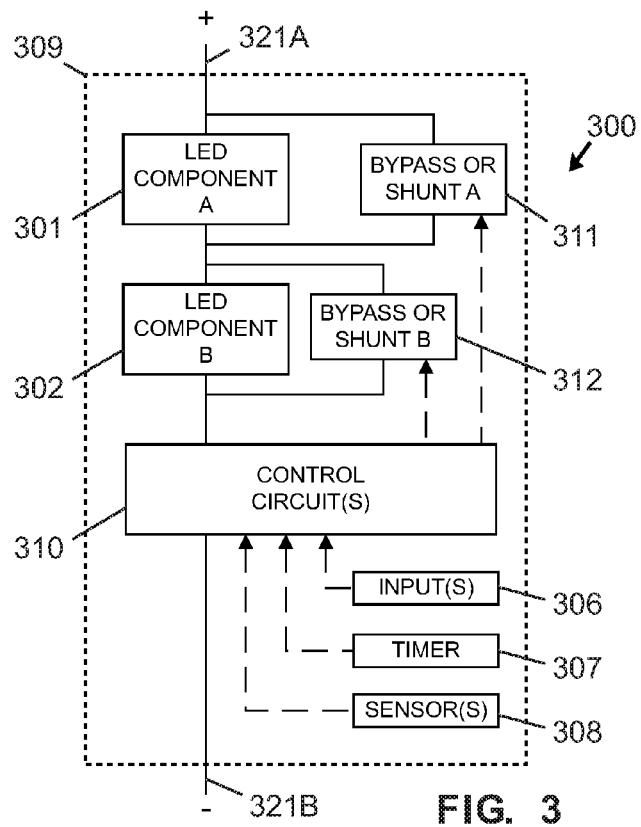
FIG._3
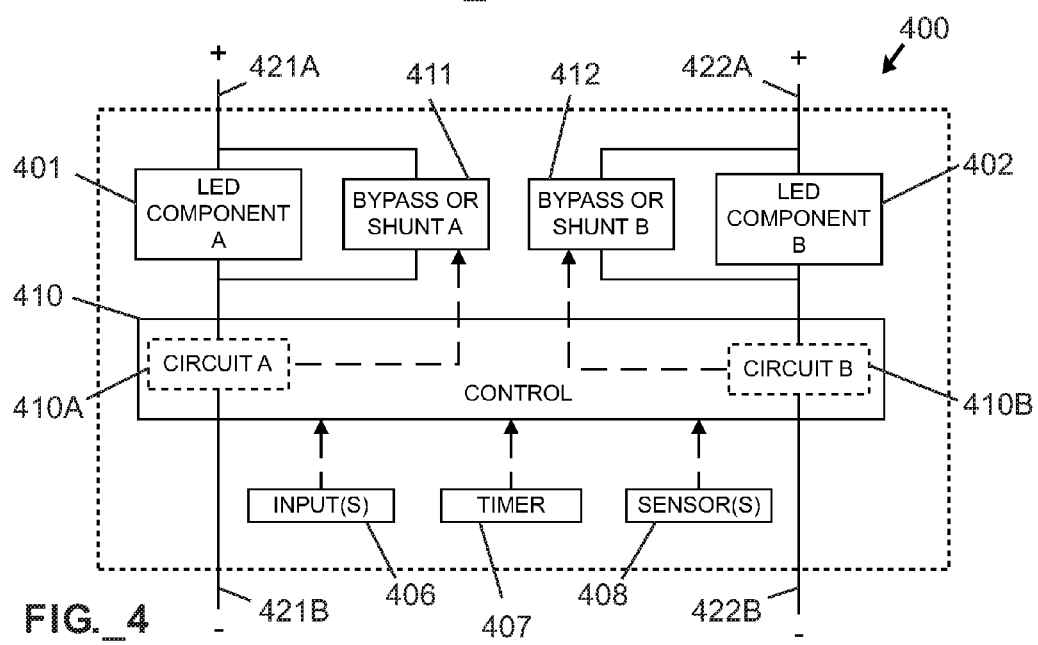
FIG._4

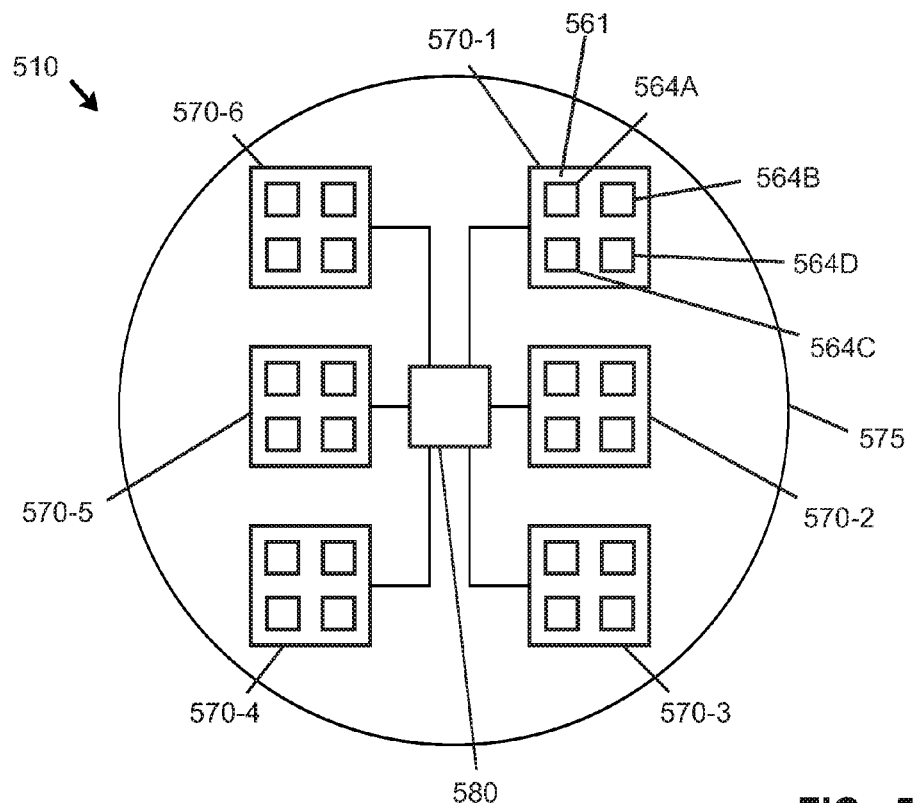
FIG._5
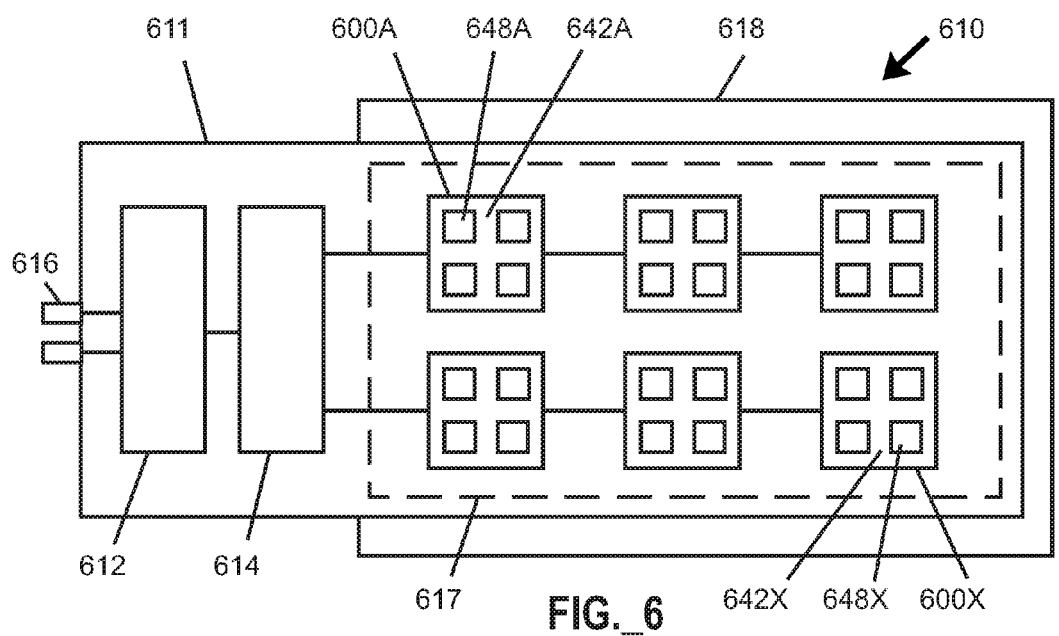
FIG._6

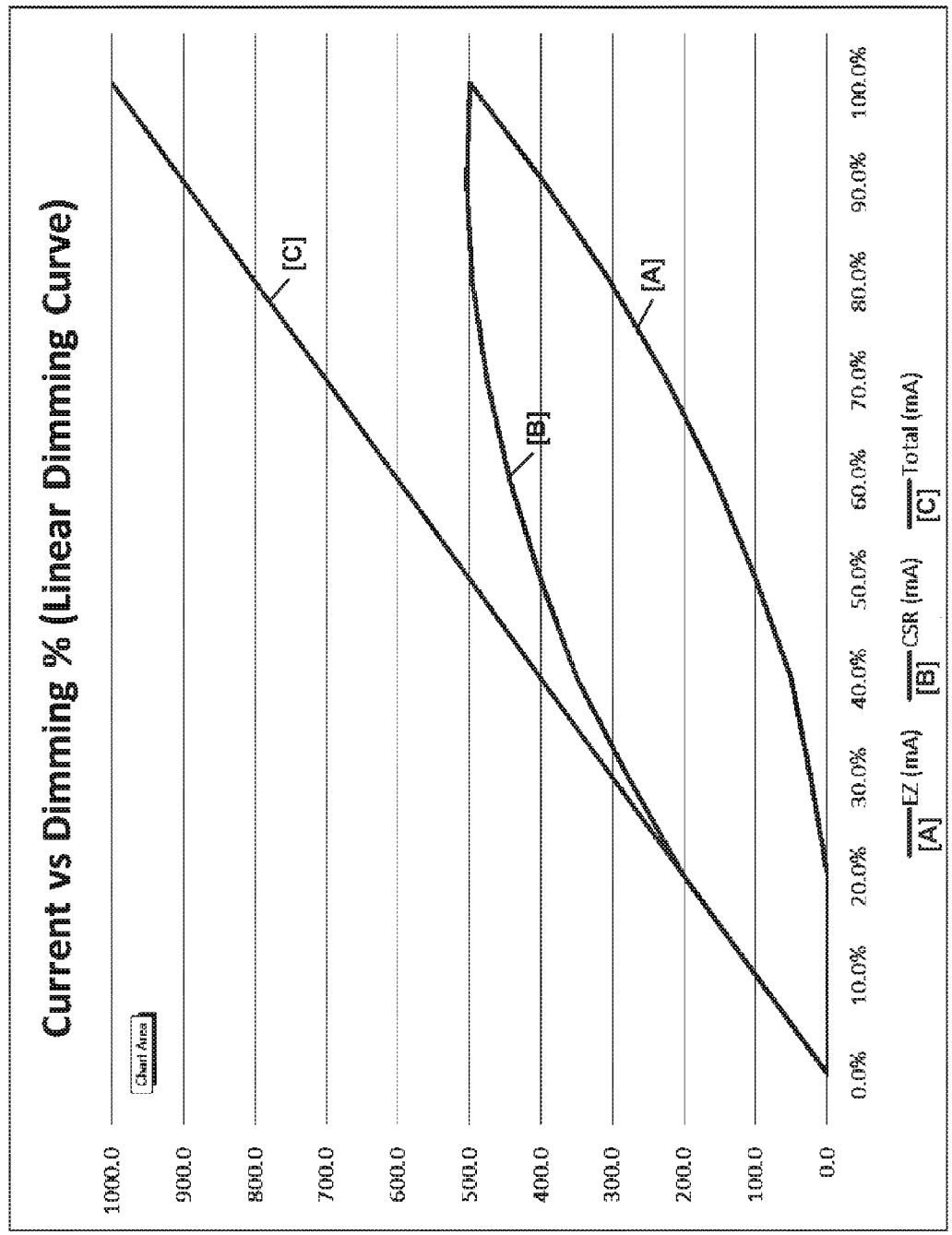
FIG._7A

| Dimming Total % "on" | Dimming EZ % "on" | Current EZ (mA) | Dimming CSR % "on" | Current CSR (mA) | Ratio CSR/EZ | Current Total (mA) |
|---|---|---|---|---|---|---|
| 0% | 0% | 0.0 | 200% | 0.0 | All CSR | 0 |
| 10% | 0% | 0.0 | 200% | 100.0 | All CSR | 100 |
| 20% | 0% | 0.0 | 200% | 200.0 | All CSR | 200 |
| 30% | 15% | 22.5 | 185% | 277.5 | 12.3 | 300 |
| 40% | 25% | 50.0 | 175% | 350.0 | 7.0 | 400 |
| 50% | 40% | 100.0 | 160% | 400.0 | 4.0 | 500 |
| 60% | 52% | 156.0 | 148% | 444.0 | 2.8 | 600 |
| 70% | 64% | 224.0 | 136% | 476.0 | 2.1 | 700 |
| 80% | 76% | 304.0 | 124% | 496.0 | 1.6 | 800 |
| 90% | 88% | 396.0 | 112% | 504.0 | 1.3 | 900 |
| 100% | 100% | 500.0 | 100% | 500.0 | 1.0 | 1000 |

FIG._7B

| Dimming Total % "on" | Dimming EZ % "on" | Current EZ (mA) | Dimming CSR % "on" | Current CSR (mA) | Ratio CSR/EZ | Current Total (mA) |
|---|---|---|---|---|---|---|
| 0% | 0% | 0.0 | 200% | 0.0 | All CSR | 0 |
| 1% | 0% | 0.0 | 200% | 10.0 | All CSR | 10 |
| 4% | 0% | 0.0 | 200% | 40.0 | All CSR | 40 |
| 9% | 15% | 6.8 | 185% | 83.3 | 12.3 | 90 |
| 16% | 25% | 20.0 | 175% | 140.0 | 7.0 | 160 |
| 25% | 40% | 50.0 | 160% | 200.0 | 4.0 | 250 |
| 36% | 52% | 93.6 | 148% | 266.4 | 2.8 | 360 |
| 49% | 64% | 156.8 | 136% | 333.2 | 2.1 | 490 |
| 64% | 76% | 243.2 | 124% | 396.8 | 1.6 | 640 |
| 81% | 88% | 356.4 | 112% | 453.6 | 1.3 | 810 |
| 100% | 100% | 500.0 | 100% | 500.0 | 1.0 | 1000 |

FIG._8B

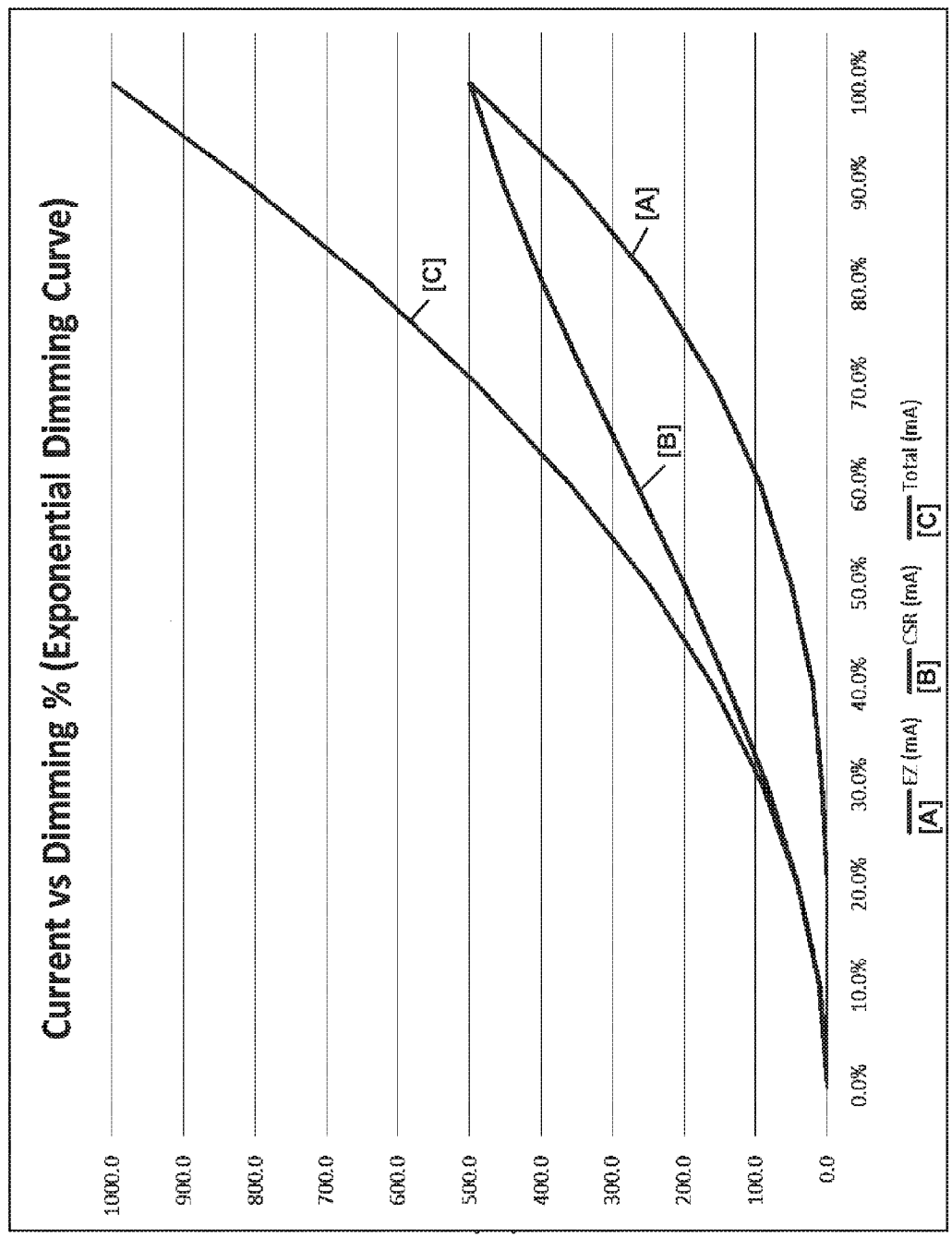
FIG._8A

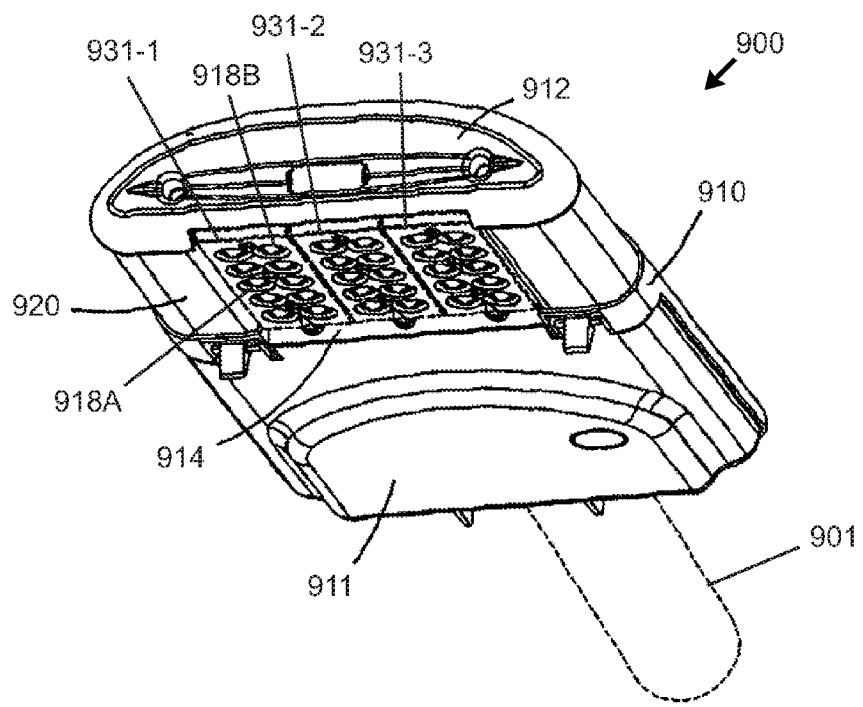
FIG._9A
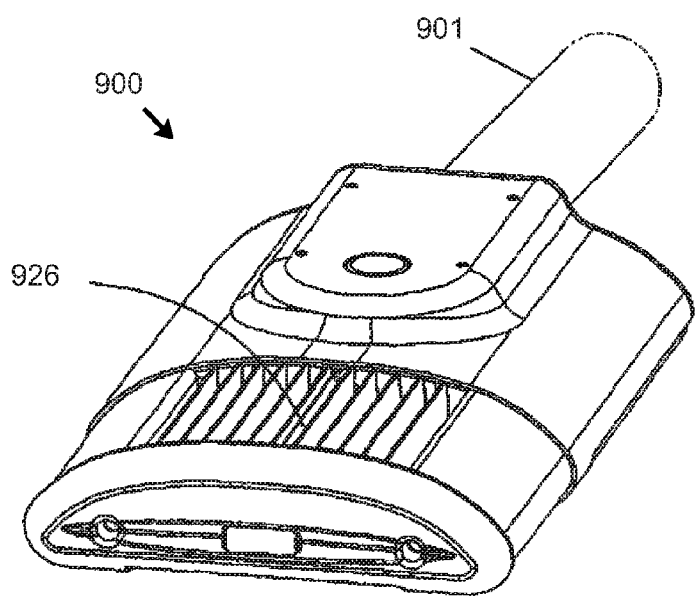
FIG._9B

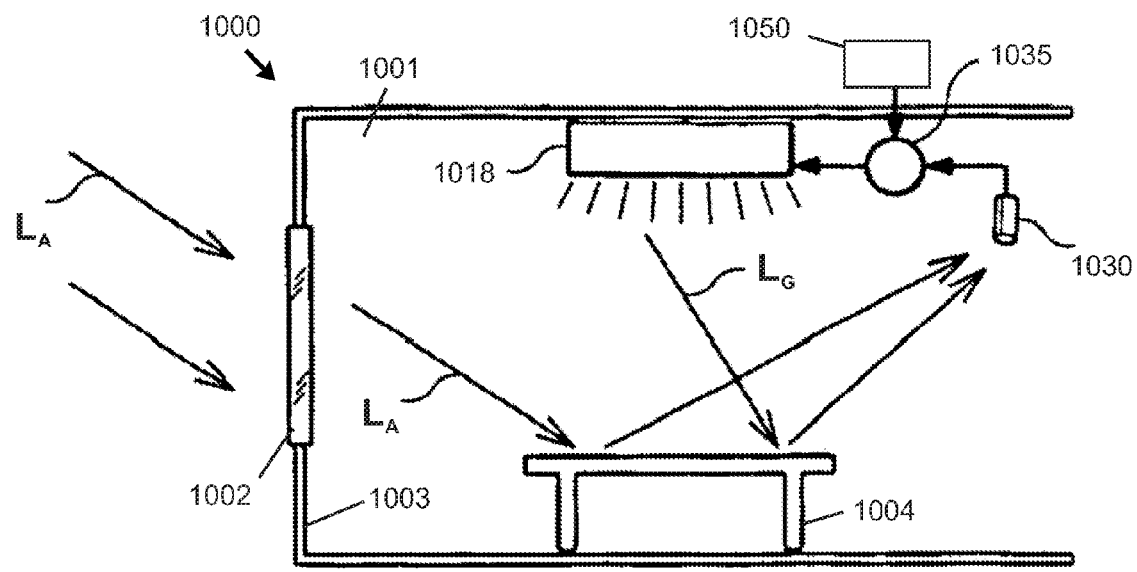
FIG._10
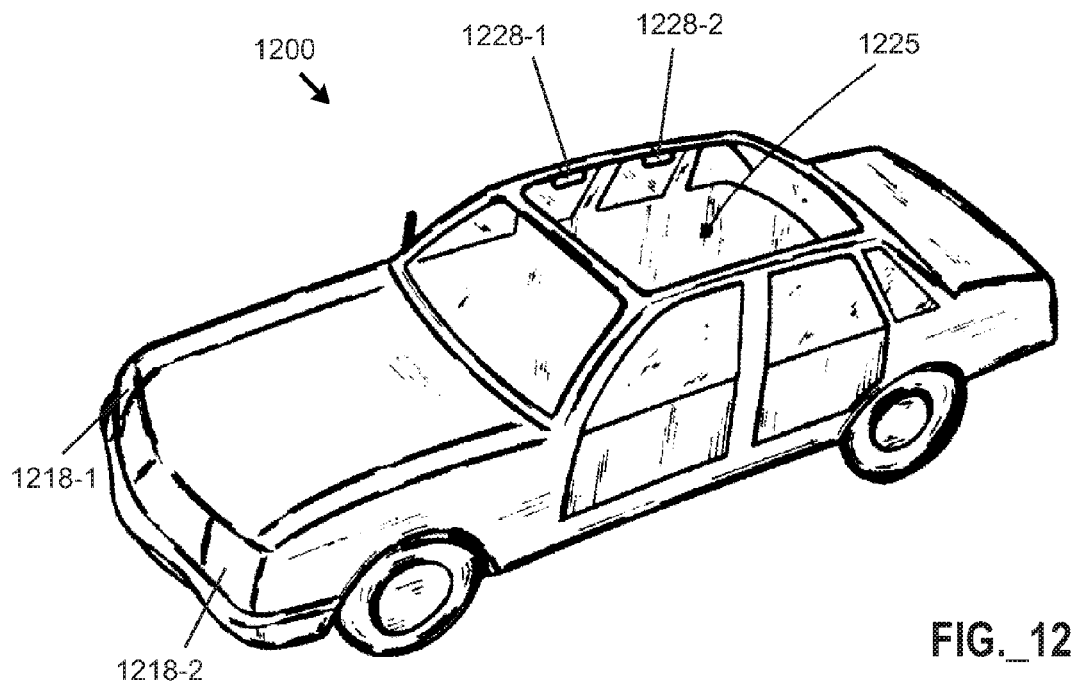
FIG._12

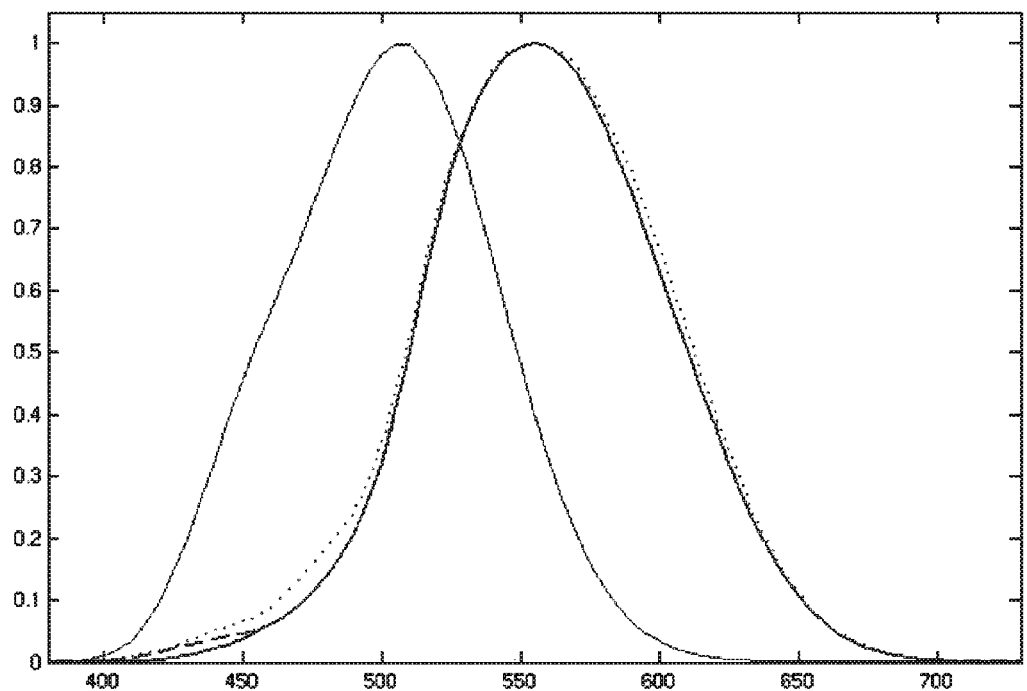
FIG._14 (RELATED ART)
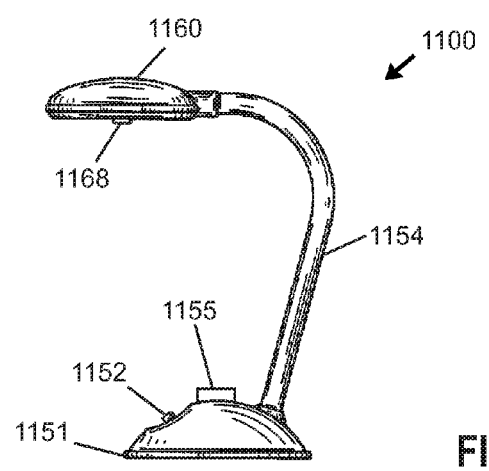
FIG._11

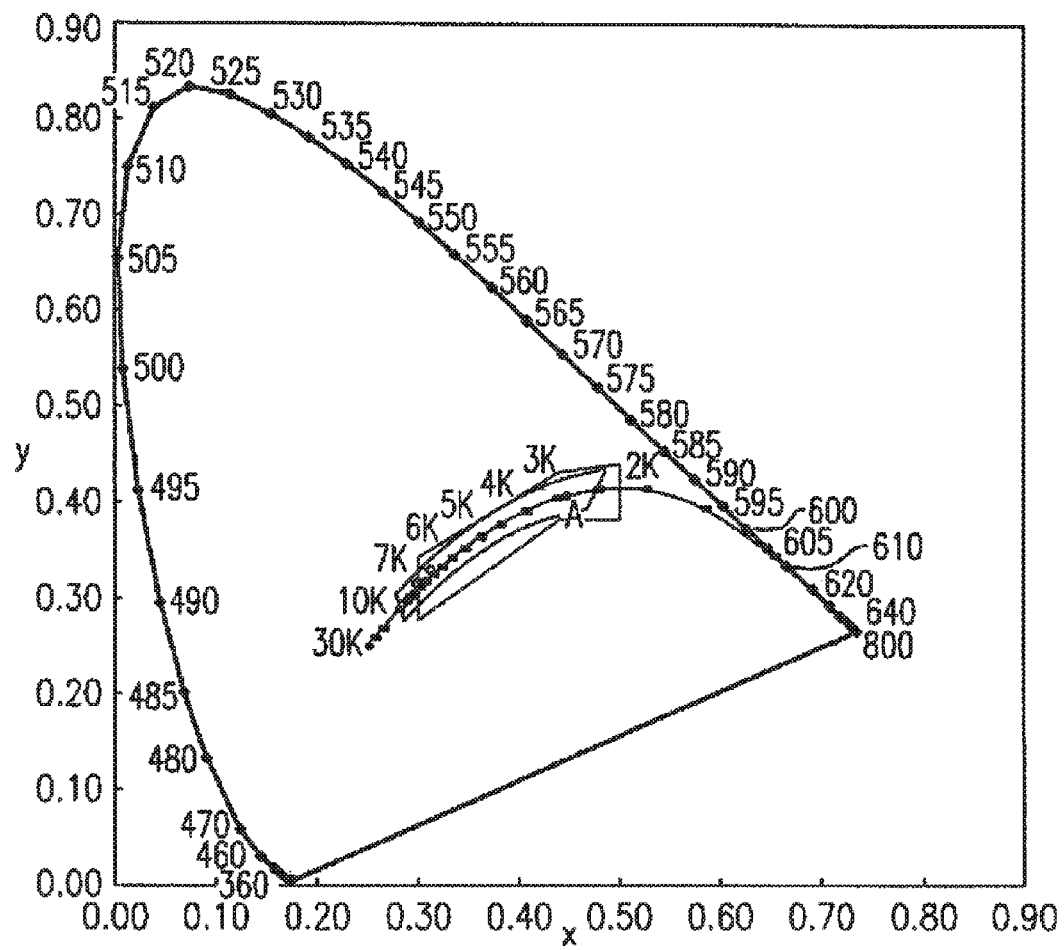
FIG._13
(RELATED ART)

SOLID STATE LIGHT EMITTING DEVICES INCLUDING ADJUSTABLE SCOTOPIC / PHOTOPIC RATIO

TECHNICAL FIELD

Subject matter herein relates to solid state lighting devices, including devices with different emitters or groups of emitters being controllable to permit adjustment of scotopic/photopic ratio of aggregate emissions, and relates to associated methods of making and using such devices.

BACKGROUND

Solid state light sources may be used to provide colored (e.g., non-white) or white light (e.g., perceived as being white or near-white). A solid state lighting device may include, for example, at least one organic or inorganic light emitting diode ("LED") or a laser. White solid state emitters have been investigated as potential replacements for white incandescent or fluorescent lamps due to reasons including substantially increased efficiency and longevity. Longevity of solid state emitters is of particular benefit in environments where access is difficult and/or where change-out costs are extremely high. Solid state light sources provide potential for very high efficiency relative to conventional incandescent or fluorescent sources, but present challenges in simultaneously achieving good efficacy, good color reproduction, and color stability (e.g., with respect to variations in operating temperature).

Color reproduction is commonly measured using Color Rendering Index (CRI) or average Color Rendering Index (CRI Ra). In the calculation of CRI, the color appearance of 14 reflective samples is simulated when illuminated by a reference illuminant and the test source, and a difference in color appearance for each sample between the test and reference illumination is computed. CRI therefore provides a relative measure of the shift in surface color and brightness of an object when lit by a particular lamp. The general color rendering index CRI Ra is a modified average utilizing the first eight indices, all of which have low to moderate chromatic saturation. The CRI Ra equals 100 (a perfect score) if the color coordinates and relative brightness of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80) for general illumination use where the colors of objects are not important. For some general interior illumination, a CRI Ra>80 is acceptable. CRI Ra>85, and more preferably, CRI Ra>90, provides greater color quality.

Aspects relating to the inventive subject matter disclosed herein may be better understood with reference to the 1931 CIE (Commission International de l'Eclairage) Chromaticity Diagram, which is well-known and readily available to those of ordinary skill in the art. The 1931 CIE Chromaticity Diagram maps out the human color perception in terms of two CIE parameters x and y. The spectral colors are distributed around the edge of the outlined space, which includes all of the hues perceived by the human eye. The boundary line represents maximum saturation for the spectral colors. The chromaticity coordinates (i.e., color points) that lie along the blackbody locus obey Planck's equation: $E(\lambda)=A\lambda^{-5}/(e^{B/T}-1)$ where E is the emission intensity, $\lambda$ is the emission wavelength, T the color temperature of the blackbody, and A and B are constants. Color coordinates that lie on or near the blackbody locus yield pleasing white light to a human observer. The 1931 CIE Diagram includes temperature listings along the blackbody locus (embodying a curved line emanating from the right corner). These temperature listings show the color path of a blackbody radiator that is caused to increase to such temperatures. As a heated object becomes incandescent, it first glows reddish, then yellowish, then white, and finally bluish. This occurs because the wavelength associated with the peak radiation of the blackbody radiator becomes progressively shorter with increased temperature, consistent with the Wien Displacement Law. Illuminants which produce light that is on or near the blackbody locus can thus be described in terms of their color temperature.

The term "white light" or "whiteness" does not clearly cover the full range of colors along the BBL since it is apparent that a candle flame and other incandescent sources appear yellowish, i.e., not completely white. Accordingly, the color of illumination may be better defined in terms of correlated color temperature (CCT) and in terms of its proximity to the BBL. The pleasantness and quality of white illumination decreases rapidly if the chromaticity point of the illumination source deviates from the BBL by a distance of greater than 0.01 in the x, y chromaticity system. This corresponds to the distance of about four MacAdam ellipses, a standard employed by the lighting industry. A lighting device emitting light having color coordinates that are within four MacAdam step ellipses of the BBL and that has a CRI Ra>80 is generally acceptable as a white light for illumination purposes. A lighting device emitting light having color coordinates within seven or eight MacAdam ellipses of the BBL and that has a CRI Ra>70 is used as the minimum standards for many other white lighting devices including compact fluorescent and solid state lighting devices.

General illumination generally has a color temperature between 2,000 K and 10,000 K, with the majority of lighting devices for general illumination being between 2,700 K and 6,500 K. The white area proximate to (i.e., within approximately eight MacAdam ellipses of) of the BBL and between 2,500 K and 10,000 K, is shown in FIG. 13 (based on the 1931 CIE diagram).

Luminous efficacy is a measure of how well a light source produces visible light, and represents the ratio of luminous flux to power (with the power being either radiant flux or total power consumed by a source, depending on context). Wavelengths of light outside of the visible spectrum are not useful for illumination because they cannot be seen by the human eye. Moreover, the human eye exhibits greater response to some wavelengths of light than to others, even within the visible spectrum. Response of the human eye to light also varies with respect to the level of intensity of light.

At the back of the eye, the retina contains millions of light receptors that convert light into electrified signals that are sent to vision centers of the brain. The retina contains two major categories of photoreceptors called cones and rods because of their geometric shapes. The very central part of the retina, called the fovea, contains only cones. The rest of the retina is populated with both rods and cones, with the number of rods exceeding the number of cones by a ratio of about 10 to 1.

Photopic vision is the vision of the eye under well-lit conditions. In humans and many other animals, photopic vision is mediated by cone cells, and allows color perception and significantly higher visual acuity than available with scotopic vision. The human eye uses three types of cones (with biological pigments having maximum absorption values at wavelengths of about 420 nm (blue), 534 nm (bluish-green), and 564 nm (yellowish green)) to sense light in three bands of color, providing maximum efficacy of about 683 lm/W at a wavelength of 555 nm (green). Scotopic vision is the vision of the eye under low light conditions. In the human eye, cone cells are nonfunctional in low light; as a result, scotopic vision is produced exclusively through rod cells, which are most sensitive to wavelengths of light around 498 nm (green-blue) and are insensitive to wavelengths longer than about 640 nm (red). For young eyes, scotopic vision may peak around 507 nm, with a sensitivity equivalent to about 1700 lm/W. Scotopic vision results in poor color discrimination. Scotopic vision occurs at luminance levels of $10^{-2}$ to $10^{-6}$ cd/m$^2$; photopic vision occurs at luminance levels of 1 to $10^6$ cd/m$^2$ (normal light); and mesopic vision occurs in intermediate lighting conditions (luminance levels of $10^{-2}$ to 1 cd/m$^2$) m, with mesoptic vision effectively being a combination of scotopic and photopic vision but yielding inaccurate visual acuity and color discrimination.

FIG. 14 illustrates scotopic and photopic luminosity functions, with the leftmost curve embodying a scotopic luminosity function (as adopted by the Commission Internationale de l'Éclairage (CIE) in 1951), and with the rightmost curve embodying photopic luminosity functions (wherein the solid line represents the CIE 1931 standard, the dashed curve represents the Judd-Vos 1978 modified data, and the dotted curve represents the Sharpe, Stockman, Jagla & Jägle 2005 data). The CIE 1931 photopic luminosity function also forms the central color matching function in the CIE 1931 color space. As shown in FIG. 1, the scotopic curve exhibits significant response above 420 nm, a peak at 507 nm, and very little response above 600 nm, whereas the photopic curve very limited response below 450 nm, a peak at 555 nm, and significant response above 650 nm before declining to zero response around 700 nm. For everyday light levels, the photopic luminosity function best approximates the response of the human eye; however, for low light levels, the response of the human eye changes, and the scotopic luminosity function applies. This difference in the scotopic and photopic luminous efficacy of the source results from the shift of eye sensitivity function peaking at 555 nm (under photopic lighting conditions) to 507 nm (under scotopic lighting conditions), also known as the Purkinje shift.

Historically, lighting manufacturers have utilized light meters to determine a lamps lumen output that are calibrated by examining the eye's sensitivity to only cone activated vision in the very central part of the retina, the fovea, while ignoring the effect of rod activated vision. As a result, traditional lighting practice accepted a single sensitivity function based on the assumption that the more light sensitive rods only functioned at very dim light levels. More recent studies have demonstrated that rod photoreceptors are active not only in dim light but also at typical interior light levels as well.

Since rods are more sensitive than cones to bluish-white light sources characteristic of higher correlated color temperature (CCT) values, light sources with higher S/P ratios may potentially provide equivalent levels of perceived brightness and visual acuity at lower output power level. This explains why environments lit by warm white (3000K) and even cool white (4100K) lamps (e.g., fluorescent lights) appear less bright than the same environment lit by lamps of a higher color temperatures, such as 5000K or above. Light with high S/P ratios, which provides higher correlated color temperature (CCT), yields relatively smaller pupils at a given photopic light level, so that object light rays are collected more at the central region of the eye, which may result in improved optical vision. Since an environment may be illuminated with lamps having higher S/P ratios at lower power levels to providing perceived brightness levels equivalent to those attainable with lamps having lower S/P ratios at higher power levels, use of lamps having higher S/P ratios may provide basis for saving energy.

Despite the potential for saving energy using lamps with higher S/P ratios, it is not straightforward to make high S/P ratio light sources with sufficient levels of color rendering (i.e., to enable color differentiation). There exists a trade-off between S/P ratio and color rendering index (CRI). This trend makes it challenging to provide a lamp capable of high S/P ratio and high CRI.

In terms of S/P ratio and CRI, the performance of current lighting technologies is typically limited. For example, incandescent light bulbs have a poor (low) S/P ratio of 1.41 despite a perfect CRI of 100. Among solid state light sources, traditional LED light sources including blue LEDs arranged to stimulate emissions of (yellow) yttrium aluminum garnet phosphors exhibit S/P ratios typically ranging from approximately 1.68 to approximately 2.38. Integration of different phosphors might improve S/P ratio or CRI, but such phosphors may also decrease luminous efficacy. A solid state lighting device including a blue LED combined with semiconductor nanocrystal quantum dots arranged to output cyan, green, yellow, and red emissions to provide higher S/P ratio values (e.g., exceeding 2.50) is disclosed by Nizamoglu, S., et al., "High scotopic/photopic ratio white light-emitting diodes integrated with semiconductor nanophosphors of colloidal quantum dots," Optics Letters (May 15, 2011) Vol. 36, No. 10, pp. 1893-1895.

The art continues to seek improved lighting devices that address one or more limitations inherent to conventional devices.

SUMMARY

The present invention relates in various aspects to solid state (e.g., LED) lighting devices including multiple solid state components having different S/P ratios.

In one aspect, the invention relates to a light emitting apparatus comprising: a first LED component arranged to generate a first spectral output including a first ratio of scotopic to photopic light (first S/P ratio), and including a first chromaticity; and a second LED component arranged to generate a second spectral output including a second ratio of scotopic to photopic light (second S/P ratio), and including a second chromaticity; wherein the first chromaticity and the second chromaticity differ by no more than seven MacAdam ellipses; and wherein the first S/P ratio is at least 20% greater than the second S/P ratio.

In another aspect, the invention relates to a light emitting apparatus comprising: a first LED component arranged to generate a first spectral output including a first ratio of scotopic to photopic light (first S/P ratio); a second LED component arranged to generate a second spectral output including a second ratio of scotopic to photopic light (second S/P ratio) that differs from the first S/P ratio; and at least one control circuit arranged to permit transitioning between at least two predefined modes of operating the first LED component and the second LED component; wherein the at least two predefined modes include a first operating mode and a second operating mode; wherein the first operating mode is arranged to generate aggregated emissions from the light emitting apparatus according to a first aggregated emission profile including a first aggregated ratio of scotopic to photopic light (first aggregated S/P ratio) and a first aggregated chromaticity; wherein the second operating mode is arranged to generate aggregated emissions from the light emitting apparatus according to a second aggregated emission profile including a second aggregated ratio of scotopic to photopic light (second aggregated S/P ratio) and a second aggregated chromaticity; wherein the first aggregated S/P ratio is at least 20% greater than the second aggregated S/P ratio; and wherein the first aggregated chromaticity differs from the second aggregated chromaticity by no more than seven Mac-Adam ellipses.

In another aspect, the invention relates to a light emitting apparatus comprising: a first LED component arranged to generate a first spectral output including a first ratio of scotopic to photopic light (first S/P ratio); a second LED component arranged to generate a second spectral output including a second ratio of scotopic to photopic light (second S/P ratio) that differs from the first S/P ratio; and at least one control circuit arranged to control operation of the first LED component according to a first dimming profile and to simultaneously control operation of the second LED component according to a second dimming profile, wherein the first dimming profile differs from the second dimming profile to effect increased color rendering index of aggregated emissions of the light emitting apparatus at maximum emissive output of the light emitting apparatus, and to effect increased aggregated S/P ratio of aggregated emissions of the light emitting apparatus at minimum emissive output of the light emitting apparatus.

In another aspect, the invention relates to a light emitting apparatus including: a first LED component arranged to generate a first spectral output including a first ratio of scotopic to photopic light (first S/P ratio); a second LED component arranged to generate a second spectral output including a second ratio of scotopic to photopic light (second S/P ratio), wherein the first S/P ratio is at least 20% greater than the second S/P ratio; and at least one control circuit arranged to independently supply current to the first LED component and the second LED component; wherein the light emitting apparatus comprises at least one of the following features (i) and (ii): (i) the light emitting apparatus is adapted to increase relative spectral output in a wavelength range below 507 nm when the light emitting apparatus is operated at an aggregated emissive output of less than 50% of maximum aggregated emissive output of the light emitting apparatus, in comparison to relative spectral output in a wavelength range below 507 nm when the light emitting apparatus is operated at maximum aggregated emissive output, and (ii) the light emitting apparatus is adapted to increase correlated color temperature of aggregated emissions by at least about 200K when the light emitting apparatus is operated at an aggregated emissive output of less than 50% of maximum aggregated emissive output, relative to correlated color temperature of aggregated emissions at maximum aggregated emissive output.

In another aspect, the invention relates to a method comprising illuminating an object, a space, or an environment, utilizing a LED device as described herein.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein Other aspects, features and embodiments of the invention will be more fully apparent from the ensuing disclosure and appended claims.

BRIEF DESCRIPTION OF THE DRAWINGS

FIG. 1A is a first perspective view of a solid state emitter package that may embody one or more LED components as defined herein according to one embodiment, the emitter package including multiple LEDs arranged over an upper surface of a common substrate with multiple anodes and cathodes along a lower surface of the substrate.

FIG. 1B is a top plan view of a first subassembly of the emitter package of FIG. 1A, lacking a lens.

FIG. 1C is a top plan view of a second subassembly of the emitter package of FIG. 1A, lacking a lens, soldermask material, and LEDs.

FIG. 1D is a top plan view of a third subassembly of the emitter package of FIG. 1A, lacking a lens and LEDs.

FIG. 1E is a bottom plan view of each of the emitter package of FIG. 1A and the subassemblies of FIGS. 1B, 1C, and 1D.

FIG. 1F is a right side elevation view of the first subassembly of FIG. 1B.

FIG. 1G is a side cross-sectional view of the third subassembly of FIG. 1D, taken along section lines "A"-"A" depicted in FIG. 1E.

FIG. 1H is an exploded right side elevation view of the emitter package of FIG. 1A, separately depicting the lens registered with the first subassembly of FIG. 1B.

FIG. 1I is a second perspective view of the emitter package of FIG. 1A.

FIG. 3 is a simplified schematic diagram illustrating interconnections between various components of a light emitting apparatus including first and second LED components arranged in series and at least one control circuit.

FIG. 4 is a simplified schematic diagram illustrating interconnections between various components of a light emitting apparatus including first and second LED components arranged in parallel and at least one control circuit.

FIG. 5 is a simplified plan view of a light emitting apparatus including multiple LED components and at least one control circuit.

FIG. 6 is a simplified plan view of another light emitting apparatus including multiple LED components and at least one control circuit.

FIG. 7A includes superimposed plots of current versus dimming percentage for first and second LED components, together with total current versus dimming percentage for a lighting apparatus that provides linear dimming response, obtained by simulation of a light emitting apparatus including a first LED component that includes a blue shifted (yellow+red) emitter, and including a second LED component that includes a cyan shifted red emitter.

FIG. 7B is a table including simulation data supporting the plots depicted in FIG. 7A.

FIG. 8A includes superimposed plots of current versus dimming percentage for first and second LED components, together with total current versus dimming percentage for the lighting apparatus that provides exponential dimming response, obtained by simulation of a light emitting apparatus including a first LED component that includes a blue shifted (yellow+red) emitter, and including a second LED component that includes a cyan shifted red emitter.

FIG. 8B is a table including simulation data supporting the plots depicted in FIG. 8A.

FIG. 9A is a lower perspective view of an outdoor floodlight (e.g., street or roadway lamp) including multiple LED components as described herein.

FIG. 9B is an upper perspective view of the outdoor floodlight of FIG. 9A

FIG. 10 is a schematic diagram of an interior space with a light fixture including multiple LED components as described herein arranged to illuminate an indoor environment.

FIG. 11 is a side elevation view of a desk lamp or table lamp including multiple LED components as described herein.

FIG. 12 is a simplified perspective view of a motor vehicle (i.e., automobile) including interior and exterior lights that each include multiple LED components as described herein.

FIG. 13 is a 1931 CIE Chromaticity Diagram including representation of the blackbody locus, and further illustrating an approximately white area bounding the blackbody locus.

FIG. 14 illustrates scotopic and photopic luminosity functions, with the leftmost curve embodying a scotopic luminosity function (as adopted by the Commission Internationale de l'Éclairage (CIE) in 1951), and with the rightmost curve embodying photopic luminosity functions (wherein the solid line represents the CIE 1931 standard, the dashed curve represents the Judd-Vos 1978 modified data, and the dotted curve represents the Sharpe, Stockman, Jagla & Jägle 2005 data).

DETAILED DESCRIPTION

Figure 2A:
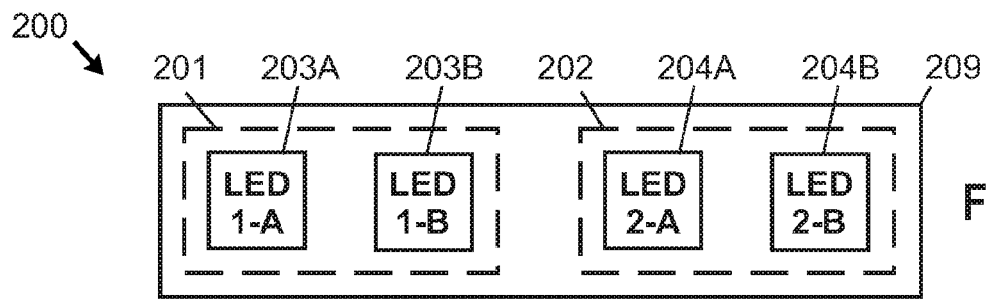
FIGS. 2A to 2H illustrate a top plan schematic views of light emitting apparatuses including first and second LED components according to various embodiments.

As noted previously, the art continues to seek improved lighting devices that address one or more limitations inherent to conventional devices. For example, it would be desirable to provide lighting devices capable of providing high S/P ratio and high CRI. It would also be desirable to provide lighting devices permitting adjustment of S/P ratio without dramatically altering CCT. It would further be desirable to provide lighting devices with high luminous efficacy and enhanced energy efficiency. It would also be desirable to provide lighting devices with reduced size, enhanced configuration flexibility, and/or extended duration of service.

The present invention relates in various aspects to solid state (e.g., LED) lighting devices including multiple solid state light emitting components having different S/P ratios. In certain embodiments, multiple LED components having different S/P ratios in a single lighting device or apparatus may be separately controlled separately, to permit aggregated S/P ratio of the lighting device to be adjusted. In certain embodiments, such adjustment of S/P ratio may be accompanied by small or minimal change in corrected color temperature; that is, in certain embodiments, LED components having different S/P ratios in the same lighting device or apparatus may have similar chromaticities (e.g., chromaticities that differ preferably by no more than seven MacAdam ellipses, preferably by no more than four MacAdam ellipses, by no more than two MacAdam ellipses) or by some other desired threshold value). In certain embodiments, a control circuit may be provided to permit transitioning between multiple predefined modes of operating a first LED component and a second LED component, wherein a first operating mode is arranged to generate a first aggregated emission S/P ratio and a first chromaticity, and a second operating mode is arranged to generate a second aggregated emission S/P ratio that differs by at least 20% from the first chromaticity and to generate a second chromaticity that differs from the first chromaticity preferably by no more than seven MacAdam ellipses, preferably by no more than four MacAdam ellipses, or by some other desired threshold value. In certain embodiments, at least one control circuit may be arranged to control operation of a first LED component according to a first dimming profile and to simultaneously control operation of a second LED component according to a second dimming profile, wherein the first dimming profile differs from the second dimming profile to effect increased color rendering index of aggregated emissions of the light emitting apparatus at maximum emissive output of the light emitting apparatus, and to effect increased aggregated S/P ratio of aggregated emissions of the light emitting apparatus at minimum emissive output of the light emitting apparatus. It is to be appreciated that the term "dimming profile" as used herein does not necessarily require operation of an individual LED component at a low output level when reduced aggregate lumens are desired, since it may be desirable to simultaneously operate a first LED component at a relatively high output level and operate a second LED component at a relatively low output level (or vice-versa) to attain a desired S/P ratio at a given aggregate lumen output level.

By providing multiple LED components having different S/P ratios (and preferably with similar chromaticities) in a single lighting device or apparatus, such components may be controlled to permit aggregated emissions to be adjusted for one or more desired effects. For example, if aggregated emissions of a high S/P ratio are desired, then a greater proportion of total power may be supplied to one or more individual LED component(s) having higher S/P ratio(s) relative to one or more other LED component(s) of the same device having lower S/P ratio(s). Conversely, if aggregated emissions of a high CRI are desired, then a greater proportion of total power may be supplied to individual LED component(s) having higher CRI value(s) relative to one or more other LED component(s) of the same device having lower CRI value(s). This can enable output of a single lighting device (or group of lighting devices) to be tailored to the preferences of different individual users, or enable output of a single lighting device (or group of lighting devices) to adjusted based upon different needs or conditions. In certain embodiments, multiple LED components of a light emitting apparatus may be simultaneously controlled with different dimming profiles to effect increased color rendering at high or maximum emissive output of the apparatus, and to effect increased aggregated S/P ratio at low or minimum emissive output of the apparatus.

Unless otherwise defined, terms used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

Embodiments of the invention are described herein with reference to cross-sectional, perspective, elevation, and/or plan view illustrations that are schematic illustrations of idealized embodiments of the invention. Variations from the shapes of the illustrations as a result, for example, of manufacturing techniques and/or tolerances, are to be expected, such that embodiments of the invention should not be construed as limited to particular shapes illustrated herein. This invention may be embodied in different forms and should not be construed as limited to the specific embodiments set forth herein. In the drawings, the size and relative sizes of layers and regions may be exaggerated for clarity.

Unless the absence of one or more elements is specifically recited, the terms "comprising," "including," and "having" as used herein should be interpreted as open-ended terms that do not preclude the presence of one or more elements.

It will be understood that when an element such as a layer, region, or substrate is referred to as being "on" another element, it can be directly on the other element or intervening elements may be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions.

The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

Solid state light emitting devices according to embodiments of the invention may include III-V nitride (e.g., gallium nitride) based LED chips or laser chips fabricated on a silicon, silicon carbide, sapphire, or III-V nitride growth substrate, including (for example) devices manufactured and sold by Cree, Inc. of Durham, N.C. Such LEDs and/or lasers may be configured to operate such that light emission occurs through the substrate in a so-called "flip chip" orientation. Such LED and/or laser chips may also be devoid of growth substrates (e.g., following growth substrate removal).

LED chips useable with lighting devices as disclosed herein may include horizontal devices (with both electrical contacts on a same side of the LED) and/or vertical devices (with electrical contacts on opposite sides of the LED). A horizontal device (with or without the growth substrate), for example, may be flip chip bonded (e.g., using solder) to a carrier substrate or printed circuit board (PCB), or wire bonded. A vertical device (without or without the growth substrate) may have a first terminal solder bonded to a carrier substrate, mounting pad, or printed circuit board (PCB), and have a second terminal wire bonded to the carrier substrate, electrical element, or PCB. Examples of vertical and horizontal LED chip structures are disclosed, for example, in U.S. Patent Application Publication No. 2008/0258130 to Bergmann et al. and in U.S. Patent Application Publication No. 2006/0186418 to Edmond et al., the disclosures of which are hereby incorporated by reference herein in their entireties. Although various embodiments shown in the figures may be appropriate for use with vertical LEDs, it is to be appreciated that the invention is not so limited, such that any combination of one or more of the following LED configurations may be used in a single solid state light emitting device: horizontal LED chips, horizontal flip LED chips, vertical LED chips, vertical flip LED chips, and/or combinations thereof, with conventional or reverse polarity. Given the variations in types, configurations, and polarities of solid state emitter chips, it is to be appreciated that the terms "anode" and "cathode" as applied to structures illustrated in the figures may be appropriate for use with certain solid state emitter chip types, but the terms may be reversed with respect to other solid state emitter chip types. In certain embodiments, wirebonds may be used to facilitate electrical connection to LED chips (whether as anode only, cathode only, or anode and cathode), but in other embodiments, wirebonds may be omitted (e.g., in cases involving use of LEDs having electrical contacts mounted solely on the bottom side thereof and soldered to conductive regions (e.g., traces) arranged on a top surface of a substrate or submount).

Solid state light emitters may be used individually or in groups to emit one or more beams to stimulate emissions of one or more lumiphoric materials (e.g., phosphors, scintillators, lumiphoric inks, quantum dots, day glow tapes, etc.) to generate light at one or more peak wavelength, or of at least one desired perceived color (including combinations of colors that may be perceived as white). Inclusion of lumiphoric (also called 'luminescent') materials in lighting devices as described herein may be accomplished by direct coating on lumiphor support elements or lumiphor support surfaces (e.g., by powder coating, inkjet printing, or the like), adding such materials to lenses, and/or by embedding or dispersing such materials within lumiphor support elements or surfaces. Examples of lumiphoric materials are disclosed, for example, in U.S. Pat. No. 6,600,175 and U.S. Patent Application Publication No. 2009/0184616. Other materials, such as light scattering elements (e.g., particles) and/or index matching materials, may be associated with a lumiphoric material-containing element or surface. LED devices and methods as disclosed herein may include have multiple LEDs of different colors, one or more of which may be white emitting (e.g., including at least one LED with one or more lumiphoric materials). One or more luminescent materials useable in devices as described herein may be down-converting or up-converting, or can include a combination of both types.

The term "LED component" as used herein refers to one or more LEDs optionally arranged to stimulate emissions of one or more lumiphoric materials. According to certain embodiments, a single LED component may include multiple LEDs devoid of any lumiphor material, a single LED arranged to stimulate emissions of a single lumiphoric material, a single LED arranged to stimulate emissions of multiple lumiphoric materials, multiple LEDs arranged to stimulate emissions of a single lumiphoric material, multiple LEDs arranged to stimulate emissions of multiple lumiphoric materials, or a single LED arranged to stimulate emissions of one or more lumiphoric materials in combination with one or more additional LEDs not arranged to stimulate emissions of one or more lumiphoric materials. When a LED component includes one or more lumiphoric materials arranged to be stimulated by at least one LED, emissions of at least one LED may be only partially absorbed by the one or more lumiphoric materials (wherein emissions output by the LED component include an unabsorbed portion of emissions of the at least one LED in combination with emissions of the one or more lumiphoric materials) according to certain embodiments, whereas in other embodiments substantially all emissions of at least one LED are absorbed by one or more lumiphoric materials (wherein emissions output by the LED component consist of emissions of the one or more lumiphoric materials). When a LED component includes multiple LEDs, such LEDs may be controlled as a group according to certain embodiments, whereas such LEDs may be separately controlled according to other embodiments.

In certain embodiments, control of one or more solid state emitter groups or sets may be responsive to a control signal (optionally including at least one sensor arranged to sense electrical, optical, and/or thermal properties and/or environmental conditions), a timer signal, and/or at least one user input, and a control system may be configured to selectively provide one or more control signals to at least one current supply circuit. In various embodiments, current to different circuits or circuit portions may be pre-set, user-defined, or responsive to one or more inputs or other control parameters.

The term "substrate" as used herein in connection with lighting apparatuses refers to a mounting element on which, in which, or over which multiple solid state light emitters (e.g., emitter chips) may be arranged or supported (e.g., mounted). Exemplary substrates useful with lighting apparatuses as described herein include printed circuit boards (including but not limited to metal core printed circuit boards, flexible circuit boards, dielectric laminates, and the like) having electrical traces arranged on one or multiple surfaces thereof, support panels, and mounting elements of various materials and conformations arranged to receive, support, and/or conduct electrical power to solid state emitters. A unitary substrate may be used to support multiple LED components (e.g., multiple groups of solid state emitter components), and may further be used to support (and/or to be in electrical communication with) various circuit elements (e.g., control circuits, driver circuit elements, rectifier circuit elements, power supply elements, current limiting circuit elements, current diverting circuit elements, dimmer circuit elements, surge protection elements, electrostatic discharge elements, and the like), sensors, timers, and/or user input elements. In certain embodiments, a substrate may include multiple emitter mounting regions each arranged to receive one or more solid state light emitters and/or LED components. In certain embodiments, substrates may include conductive regions arranged to conduct power to solid state light emitters or solid state light emitter groups arranged thereon or there over. In other embodiments, substrates may be insulating in character, and electrical connections to solid state emitters may be provided by other means (e.g., via conductors not associated with substrates).

In certain embodiments, a substrate, mounting plate, or other support element on or over which multiple LED components may be mount may comprise one or more portions of, or all of, a printed circuit board (PCB), a metal core printed circuit board (MCPCB), a flexible printed circuit board, a dielectric laminate (e.g., FR-4 boards as known in the art) or any suitable substrate for mounting LED chips and/or LED packages. In certain embodiments, a substrate may comprise one or more materials arranged to provide desired electrical isolation and high thermal conductivity. In certain embodiments, at least a portion of a substrate may include a dielectric material to provide desired electrical isolation between electrical traces or components of multiple LED sets. In certain embodiments, a substrate can comprise ceramic such as alumina, aluminum nitride, silicon carbide, or a polymeric material such as polyimide, polyester, etc. In certain embodiments, substrate can comprise a flexible circuit board or a circuit board with plastically deformable portions to allow the substrate to take a non-planar (e.g., bent) or curved shape allowing for directional light emission with LED chips of one or more LED components also being arranged in a non-planar manner.

In certain embodiments, at least a portion of substrate can comprise a MCPCB, such as a "Thermal-Clad" (T-Clad) insulated substrate material, available from The Bergquist Company of Chanhassen, Minn. A MCPCB substrate may reduce thermal impedance and conduct heat more efficiently than standard circuit boards. In certain embodiments, a MCPCB can also include a base plate on the dielectric layer, opposite the LED string circuit, and can comprise a thermally conductive material to assist in heat spreading. In certain embodiments, the base plate can comprise different material such as copper, aluminum or aluminum nitride. The base plate can have different thicknesses, such within the range of 100 to 2000 μm. a substrate can comprise any suitable material and any suitable thickness (e.g., approximately 0.5 mm to more than 5 mm).

In certain embodiments, a substrate can be provided in a relatively small form factor in any desired shape (e.g., square, round, non-square, non-round, symmetrical and/or asymmetrical). Examples of small footprints or form factors of multi-emitter solid state light emitting apparatuses (e.g., including LED packages) including multiple LED component as described herein may include less than $5 cm^2$, less than $3 cm^2$, less than $2 cm^2$, less than $1 cm^2$, less than $0.5 cm^2$, less than $0.3 cm^2$, or less than $0.25 cm^2$. LED chips of any suitable size or form factor may be included in a multi-emitter lighting emitting apparatus, including chips having a width of up to about 2000 microns, up to about 1000 microns, up to about 500 microns, up to about 350 microns, or any other suitable size. In other embodiments, a substrate may comprise a larger form factor, such as may be suitable for replacement of elongated fluorescent tube-type bulbs or replacement of relatively large light fixtures.

In certain embodiments, one or more LED components can include one or more "chip-on-board" (COB) LED chips and/or packaged LED chips that can be electrically coupled or connected in series or parallel with one another and mounted on a portion of a substrate. In certain embodiments, COB LED chips can be mounted directly on portions of substrate without the need for additional packaging. In certain embodiments, LED components may use packaged LED chips in place of COB LED chips. For example, in certain embodiments, LED components may utilize comprise serial or parallel arrangements of XLamp XM-L High-Voltage (HV) LED packages available from Cree, Inc. of Durham, N.C. Lighting devices as disclosed herein may include LED components including solid state emitters or groups of solid state emitters configured in various arrangements depending upon the application and/or voltage range desired. In certain embodiments, separately controllable solid stage emitters or groups of solid state emitters may be configured to operate at different voltages. Examples of possible operating voltages include, but are not limited to, 3V, 6V, and 12V.

In certain embodiments, one or more reflector elements (either symmetrical or asymmetrical in nature) may be attached to, integrally formed with, or otherwise associated with a substrate and arranged to reflect emissions from one or more (preferably multiple) LED components, such as to direct emissions in one or more desired directions and/or generate one or more desired beam patterns. In certain embodiments, one or more optical elements may be arranged to receive emissions from one or more (preferably multiple) LED components, and arranged to interact with such emissions to provide desired (e.g., light mixing, focusing, collimation, dispersion, and/or beam shaping) utility in either symmetrical or asymmetrical fashion. In certain embodiments, one or more optical elements may be provided in addition to one or more reflector elements.

In certain embodiments, lighting devices or light emitting apparatuses as described herein may include at least one LED with a peak wavelength in the visible range. In certain embodiments, one or more short wavelength solid state emitters (e.g., blue and/or cyan LED) may be used to stimulate emissions from a mixture of lumiphoric materials, or discrete layers of lumiphoric material (e.g., including red, yellow, and green lumiphoric materials). In certain embodiments, at least two independently controlled short or medium wavelength (e.g., blue, cyan, or green) LEDs may be provided in a single LED component and arranged to stimulate emissions of lumiphors, which may comprise the same or different materials in the same or different amounts or concentrations relative to the LEDs. In certain embodiments, multiple electrically activated (e.g., solid state) emitters are provided, with groups of emitters being separately controllable relative to one another. In certain embodiments, one or more groups of solid state emitters as described herein may include at least a first LED chip comprising a first LED peak wavelength, and include at least a second LED chip comprising a second LED peak wavelength that differs from the first LED peak wavelength by at least 20 nm, or by at least 30 nm (preferably, but not necessarily, in the visible range). In certain embodiments, solid state emitters with peak wavelengths in the ultraviolet (UV) range may be used to stimulate emissions of one or more wavelength conversion materials. Emitters having similar output wavelengths may be selected from targeted wavelength bins. Emitters having different output wavelengths may be selected from different wavelength bins, with peak wavelengths differing from one another by a desired threshold (e.g., at least 20 nm, at least 30 nm, at least 50 nm, or another desired threshold).

In certain embodiments, one or more LED components may include at least one BSY or white emitter component (including a blue solid state emitter arranged to stimulate emissions of a yellow lumiphor) and at least one red emitter (e.g., a red LED and/or a LED (e.g., UV, blue, cyan, green, etc.) arranged to stimulate emissions of a red lumiphor). Addition of at least one red emitter may be useful to enhance warmth of the BSY or white emissions and improve color rendering, with the resulting combination being termed BSY+R or warm white. In certain embodiments, constituents of LED components (e.g., BSY and red emitters) may be separately controlled, as may be useful to adjust color temperature and/or to maintain a desired color point as temperature increases, optionally in response to signals received from one or more temperature sensors. In various embodiments, BSY components and red components may be controlled together in a single LED component, or may be aggregated into different LED components that are separately controlled. One or more supplemental solid state emitters and/or lumiphors of any suitable color (or peak wavelength) may be substituted for one or more red light-emitting components, or may be provided in addition to one or more red light-emitting components.

In certain embodiments, a solid state lighting device may include one or more groups or sets of BSY light emitting components supplemented with one or more supplemental emitters, such as long wavelength blue, cyan, green, yellow, amber, orange, red or any other desired colors. Presence of a cyan solid state emitter and/or a cyan lumiphor is particularly desirable in certain embodiments to permit adjustment or tuning of color temperature of a lighting device, since the tie line for a solid state emitter having a ~487 nm peak wavelength is substantially parallel to the blackbody locus for a color temperature of less than 3000K to about 4000K. In certain embodiments, one or more constituents of a LED component may be controlled separately, such as may be useful to adjust intensity, permit tuning of output color, permit tuning of color temperature, and/or affect dissipation of heat generated by the light emitting components.

In certain embodiments, one or more LED components as described herein may include multiple independently controllable BSY emitters, optionally supplemented with one or more additional LEDs and/or lumiphors. In certain embodiments, multiple BSY emitters present in one or more components of a single lighting device (e.g., whether in the same or different components, optionally within one or more solid state emitter packages) may include blue LEDs with different peak wavelengths (e.g., LED peak wavelengths that differ from one another by one of the following wavelength thresholds: at least 5 nm, at least 10 nm, at least 15 nm, at least 20 nm, at least 25 nm, at least 30 nm, at least 35 nm, and at least 40 nm), and/or yellow lumiphors with different peak wavelengths (e.g., lumiphor peak wavelengths that differ from one another by one of the following wavelength thresholds: at least 5 nm, at least 10 nm, at least 15 nm, at least 20 nm, at least 25 nm, at least 30 nm, at least 35 nm, and at least 40 nm).

The expression "peak wavelength", as used herein, means (1) in the case of a solid state light emitter, the peak wavelength of light that the solid state light emitter emits if it is illuminated, and (2) in the case of a lumiphoric material, the peak wavelength of light that the lumiphoric material emits if it is excited.

In certain embodiments, light emitting apparatuses as disclosed herein may be used as described in U.S. Pat. No. 7,213,940, which is hereby incorporated by reference as if set forth fully herein. In certain embodiments, a combination of light (aggregated emissions) exiting a lighting emitting apparatus including multiple LED components as disclosed herein, may, in an absence of any additional light, produce a mixture of light having x, y color coordinates within an area on a 1931 CIE Chromaticity Diagram defined by points having coordinates (0.32, 0.40), (0.36, 0.48), (0.43, 0.45), (0.42, 0.42), (0.36, 0.38). In certain embodiments, combined emissions from a lighting emitting apparatus as disclosed herein may embody at least one of (a) a color rendering index (CRI Ra) value of at least 85, and (b) a color quality scale (CQS) value of at least 85.

Some embodiments of the present invention may use solid state emitters, emitter packages, fixtures, luminescent materials/elements, power supply elements, control elements, and/or methods such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272; with the disclosures of the foregoing patents and published patent applications being hereby incorporated by reference as if set forth fully herein.

The expressions "lighting device" and "light emitting apparatus", as used herein, are not limited, except that they are capable of emitting light. That is, a lighting device or light emitting apparatus can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or backlighting (e.g., backlight poster, signage, LCD displays), light bulbs, bulb replacements (e.g., for replacing AC incandescent lights, low voltage lights, fluorescent lights, etc.), outdoor lighting, street lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting-work lights, etc., mirrors/vanity lighting, or any other light emitting devices. In certain embodiments, lighting devices or light emitting apparatuses as disclosed herein may be self-ballasted.

The inventive subject matter further relates in certain embodiments to an illuminated enclosure (the volume of which can be illuminated uniformly or non-uniformly), comprising an enclosed space and at least one lighting device or light emitting apparatus as disclosed herein, wherein at least one lighting device or light emitting apparatus illuminates at least a portion of the enclosure (uniformly or non-uniformly). The inventive subject matter further relates to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, a LCD display, a cave, a tunnel, a yard, a lamppost, etc., having mounted therein or thereon at least one lighting device or light emitting apparatus as described herein. Methods include illuminating an object, a space, or an environment, utilizing one or more lighting devices or light emitting apparatuses as disclosed herein.

In certain embodiments, a lighting apparatus includes multiple LED components having different S/P ratios, but preferably having similar chromaticities, are arranged on a common substrate or mounting plate, and are subject to being controlled by one or more control circuits. In certain embodiments, a lighting apparatus includes multiple LED components, wherein each LED component is separately arranged to output light having a color temperature in a range of from 2000K to 8000K, and more preferably in a range of from 2700K to 5000K.

In certain embodiments, a lighting apparatus as disclosed herein includes multiple LED components arranged in an array (e.g., a two-dimensional array). In certain embodiments, emitters of a first LED component may be interspersed with emitters of a separately controllable second LED component (e.g., with emitters of a first LED component arranged in a two-dimensional array that is superimposed with emitters of a second LED component arranged in a two dimensional array), such as may be beneficial to promote color mixing, optionally aided with one or more diffuser elements.

In certain embodiments, individual emitters within a multi-emitter LED component may be arranged in series, in parallel, or in a series-parallel relationship. In certain embodiments, multiple LED components of a solid state light emitting apparatus may be arranged in series, in parallel, or in series-parallel relationship. In certain embodiments, modulation of current and/or duty cycle may be performed with one or more current bypass and/or current shunt elements that may be optionally controlled by one or more control circuits. One or more control circuits may be optionally controlled responsive to one or more user input elements, one or more timer elements, and/or one or more sensor elements (e.g., temperature sensing element, photosensors, etc.). In certain embodiments, at least one photosensor (or possibly multiple photosensors) may be used to sense ambient light level and/or color point, and one or more output signals of such sensor(s) may be used to affect operation of one or more lighting apparatuses described herein (e.g., to responsively adjust level (e.g., intensity)/dimming and/or color point of aggregate emissions of the lighting apparatus(es)). In certain embodiments, one or more control circuit elements and/or sensors may be supported by and/or in electrical communication with a substrate of a lighting apparatus.

In certain embodiments, a light emitting apparatus may comprise: a first LED component arranged to generate a first spectral output including a first ratio of scotopic to photopic light (first S/P ratio), and including a first chromaticity; and a second LED component arranged to generate a second spectral output including a second ratio of scotopic to photopic light (second S/P ratio), and including a second chromaticity; wherein the first chromaticity and the second chromaticity differ by no more than seven MacAdam ellipses (or preferably differ by no more than four MacAdam ellipses, still more preferably differ by no more than two MacAdam ellipses); and wherein the first S/P ratio is at least 20% greater than the second S/P ratio (or preferably at least 50% greater than the second S/P ratio, or more preferably at least 100% greater than the second S/P ratio, or still more preferably at least 150% greater than the second S/P ratio).

In certain embodiments, the first LED component includes a first LED including a first peak wavelength, the second LED component includes a second LED including a second peak wavelength, and the first peak wavelength differs from the second peak wavelength by at least 10 nm. In certain embodiments, at least one LED component includes at least one LED arranged to stimulate emissions of at least one lumiphor, wherein the at least one lumiphor comprises a peak wavelength in a range of from 481 nm to 505 nm.

In certain embodiments, a light emitting apparatus may include a first LED component arranged to output cyan shifted red emissions and a second LED component arranged to output blue shifted yellow emissions. In such an apparatus, a first LED component may comprise a first LED including a peak wavelength in a range of from 481 nm to 505 nm arranged to stimulate emissions of at least one first lumiphor including a peak wavelength in a range of from 591 nm to 690 nm, and a second LED component may comprise a second LED including a peak wavelength in a range of from 430 nm to 480 nm arranged to stimulate emissions of at least one second lumiphor including a peak wavelength in a range of from 561 nm to 590 nm.

In certain embodiments, a light emitting apparatus may include a first LED component arranged to output blue shifted cyan emissions in combination with red LED emissions, and may include a second LED component arranged to output blue shifted yellow emissions. In such an apparatus, a first LED component may comprise a first LED including a peak wavelength in a range of from 430 nm to 480 nm arranged to stimulate emissions of at least one first lumiphor including a peak wavelength in a range of from 481 nm to 505 nm, with the first LED component further comprising an additional LED including a peak wavelength in a range of from 591 nm to 690 nm; and the second LED component may comprise a second LED including a peak wavelength in a range of from 430 nm to 480 nm arranged to stimulate emissions of at least one second lumiphor including a peak wavelength in a range of from 561 nm to 590 nm.

In certain embodiments, a light emitting apparatus may include a first LED component arranged to output blue shifted cyan emissions in combination with green shifted red emissions, and may include a second LED component arranged to output blue shifted yellow emissions. In such an apparatus, a first LED component may comprise a first LED including a peak wavelength in a range of from 430 nm to 480 nm arranged to stimulate emissions of at least one first lumiphor including a peak wavelength in a range of from 481 nm to 505 nm, and comprises an additional LED including a peak wavelength in a range of from 506 nm to 560 nm arranged to stimulate emissions of at least one additional lumiphor including a peak wavelength in a range of from 591 nm to 690 nm; and a second LED component may comprise a second LED including a peak wavelength in a range of from 430 nm to 480 nm arranged to stimulate emissions of at least one second lumiphor including a peak wavelength in a range of from 561 nm to 590 nm.

In certain embodiments, a light emitting apparatus may include a first LED component arranged to output ultraviolet-stimulated cyan emissions in combination with red LED emissions, and may include a second LED component arranged to output blue shifted yellow emissions. In such an apparatus, a first LED component may comprise a first LED including a peak wavelength in a range of from 380 nm to 425 nm arranged to stimulate emissions of at least one first lumiphor including a peak wavelength in a range of from 481 nm to 505 nm, and may comprises an additional LED including a peak wavelength in a range of from 591 nm to 690 nm; and a second LED component may include a second LED including a peak wavelength in a range of from 430 nm to 480 nm arranged to stimulate emissions of at least one second lumiphor including a peak wavelength in a range of from 561 nm to 590 nm.

In certain embodiments, a light emitting apparatus may include a first LED component arranged to output ultraviolet-stimulated cyan emissions in combination with green shifted red emissions, and may include a second LED component arranged to output blue shifted yellow emissions. In such an apparatus, a first LED component may comprise a first LED including a peak wavelength in a range of from 380 nm to 425 nm arranged to stimulate emissions of at least one first lumiphor including a peak wavelength in a range of from 481 nm to 505 nm, and the first LED components comprises an additional LED including a peak wavelength in a range of from 506 nm to 560 nm arranged to stimulate emissions of at least one additional lumiphor including a peak wavelength in a range of from 591 nm to 690 nm; and a second LED component may comprise a second LED including a peak wavelength in a range of from 430 nm to 480 nm arranged to stimulate emissions of at least one second lumiphor including a peak wavelength in a range of from 561 nm to 590 nm.

In certain embodiments, a light emitting apparatus may include a first LED component arranged to output cyan shifted yellow emissions, and may include a second LED component arranged to output blue shifted red emissions. In such an apparatus, a first LED component may comprise a first LED including a peak wavelength in a range of from 481 nm to 505 nm arranged to stimulate emissions of at least one first lumiphor including a peak wavelength in a range of from 561 nm to 590 nm, and a second LED component may comprise a second LED including a peak wavelength in a range of from 430 nm to 480 nm arranged to stimulate emissions of at least one second lumiphor including a peak wavelength in a range of from 591 nm to 690 nm.

In certain embodiments, a light emitting apparatus may include a first LED component arranged to output cyan shifted yellow emissions, and may include a second LED component arranged to output green shifted red emissions. In such an apparatus, a first LED component may comprise a first LED including a peak wavelength in a range of from 481 nm to 505 nm arranged to stimulate emissions of at least one first lumiphor including a peak wavelength in a range of from 561 nm to 590 nm, and a second LED component may comprise a second LED including a peak wavelength in a range of from 506 nm to 560 nm arranged to stimulate emissions of at least one second lumiphor including a peak wavelength in a range of from 591 nm to 690 nm.

In certain embodiments, a light emitting apparatus may include at least one control circuit arranged to independently supply current to the first LED component and the second LED component. In certain embodiments, a light emitting apparatus may include at least one element operatively coupled to the at least one control circuit to affect dimming of the first LED component and the second LED component, wherein the at least one element is selected from the group consisting of a user input element, a timer, and a photosensor. Multiple elements of the preceding group may be provided. In certain embodiments, a user input element may be used to adjust S/P ratio of a light emitting apparatus by adjusting absolute or relative current or duty cycle (e.g., as may be used to effect dimming) supplied to different LED components of a lighting apparatus. In certain embodiments, a timer may be pre-set or programmed by a user to operate at a desired S/P ratio (or specific ratio of current or duty cycle among LED components having different duty cycles) for one or more time periods, and to operate at at least one different S/P ratio (or different specific ratio of current or duty cycle among the LED components) at one or more other time periods—such as may be useful to affect color rendering and/or power consumption. In certain embodiments, a photosensor may be used to affect S/P ratio of a light emitting apparatus, such as by adjusting current and/or duty cycle of different LED components responsive to presence, absence, or level of ambient light, or responsive to presence or absence of motion (e.g., as indicative of presence or absence of a person, a vehicle, or another object).

In certain embodiments, at least one control circuit arranged to control one or more LED components may include a current supply circuit configured to independently apply an on-state drive current to each individual solid state emitter or each individual LED component. In certain embodiments, drive currents may be pulsed, such as with pulse width modulation. Control of one or more solid state emitters may be responsive to a control signal (optionally including at least one sensor arranged to sense electrical, optical, and/or thermal properties and/or environmental conditions), and a control system may be configured to selectively provide one or more control signals to at least one current supply circuit. In various embodiments, current to different circuits or circuit portions may be pre-set, user-defined, or responsive to one or more inputs or other control parameters.

Since increased S/P ratio corresponds to increased relative blue and/or cyan spectral content, and it may be desired to obtain increased aggregated S/P ratio at low aggregate emissive output levels, in certain embodiments, spectral output of a lighting device may be shifted to include increased blue (and/or cyan) spectral content when aggregate lumen output is at a low level. This is contrary to the conventional goal with LED lighting devices to increase red content at low (aggregate dimmed) output levels in order to mimic incandescent light sources. Accordingly, in certain embodiments, a light emitting apparatus includes a first LED component arranged to generate a first spectral output including a first S/P ratio, a second LED component arranged to generate a second spectral output including a second S/P ratio, wherein the first S/P ratio is at least 20% greater than the second S/P ratio, and at least one control circuit arranged to independently supply current to the first LED component and the second LED component, wherein the light emitting apparatus is adapted to increase relative spectral output in a wavelength range below 507 nm when the light emitting apparatus is operated at a reduced aggregated emissive output (e.g., in lumens, such as at a reduced output of less than 20%, less than 30%, less than 40%, less than 50%, or less than 60% of maximum aggregated emissive output), in comparison to relative spectral output in a wavelength range below 507 nm when the light emitting apparatus is operated at maximum aggregated emissive output. In other words, relative spectral output at wavelengths below 507 nm is increased (representing increased blue and/or cyan content) when the lighting emitting apparatus is dimmed to a specified threshold (e.g., 20% or below, 30% or below, 40% or below, 50% or below, or 60% or below)

of maximum aggregated output. In certain embodiments, the increased relative spectral output below 507 nm is preferably increased by at least one of the following thresholds: 5%, 10%, 15%, 20%, 25%, and 30%. One method of determining relative emissions below 507 nm is to integrate all spectral output (e.g., in milliwatts) below 507 nm, and compare the resulting value to total spectral output (preferably total spectral output in the visible range to yield relative visible spectral output). In certain embodiments, correlated color temperature (CCT) is shifted when such a light emitting apparatus is dimmed. For example, when the apparatus is operated at a reduced aggregated emissive output (e.g., in lumens, such as at a reduced output of less than 20%, less than 30%, less than 40%, less than 50%, or less than 60% of maximum aggregated emissive output), then relative to operation at maximum aggregated emissive output, CCT may be increased preferably by at least one of the following thresholds: at least about 100K, 200K, 300K, 400K, 500K, 600K, 700K, 800K, 900K, 1000K, 1200K, 1500K, or 2000K. Since increased color temperature is correlated with increased blue spectral content, increasing color temperature during dimmed operation will tend to increase S/P ratio of the resulting aggregated emissions. In certain embodiments, the first LED component includes a first chromaticity, the second LED component includes a second chromaticity, and the first chromaticity and the second chromaticity differ by no more than seven MacAdam ellipses.

In certain embodiments, a method of using a light emitting apparatus includes independently controlling supply of current to first and second LED components having differing S/P ratios (e.g., preferably differing by at least 20% or any other threshold as disclosed herein), and increasing relative spectral output in a wavelength range below 507 nm when the light emitting apparatus is operated at an aggregated emissive output of less than 50% of maximum aggregated emissive output of the light emitting apparatus, in comparison to relative spectral output in a wavelength range below 507 nm when the light emitting apparatus is operated at maximum aggregated emissive output.

In certain embodiments, a method of using a light emitting apparatus includes independently controlling supply of current to first and second LED components having differing S/P ratios (e.g., preferably differing by at least 20% or any other threshold as disclosed herein), and increasing correlated color temperature of aggregated emissions by at least about 200K when the light emitting apparatus is operated at an aggregated emissive output of less than 50% of maximum aggregated emissive output, relative to correlated color temperature of aggregated emissions at maximum aggregated emissive output.

In certain embodiments, a method of using a light emitting apparatus includes independently controlling supply of current to first and second LED components having differing S/P ratios (e.g., preferably differing by at least 20% or any other threshold as disclosed herein), in order to alter S/P ratio of aggregated emissions while maintaining aggregated emissions within a range of no more than seven (preferably no more than four) MacAdam ellipses of a target correlated color temperature.

Certain embodiments may involve use of solid state emitter packages. A solid state emitter package may include at least one solid state emitter chip (more preferably multiple solid state emitter chips) that is enclosed with packaging elements to provide environmental protection, mechanical protection, color selection, and/or light focusing utility, as well as electrical leads, contacts, and/or traces enabling electrical connection to an external circuit. One or more emitter chips may be arranged to stimulate one or more lumiphoric materials, which may be coated on, arranged over, or otherwise disposed in light receiving relationship to one or more solid state emitters. A lens and/or encapsulant materials, optionally including lumiphoric material, may be disposed over solid state emitters, lumiphoric materials, and/or lumiphor-containing layers in a solid state emitter package. Multiple solid state emitters may be provided in a single package. In certain embodiments, multiple LED components as described herein may be provided in a single package. In other embodiments, one or more LED components as described herein may include one or more LED packages. In certain embodiments, LED components are separately controllable. In certain embodiments, multiple LEDs within a LED component may be controlled independently of one another.

In certain embodiments, a package including multiple solid state emitters may include multiple die attach pads, with a single die attach pad supporting each separately controllable solid state emitter or each separately controllable group of solid state emitters. A package including multiple solid state emitters may include a single lens (e.g., a molded lens) arranged to transmit at least a portion of light emanating from each solid state emitter. In certain embodiments, a molded lens may be arranged in direct contact with LED chips, die attach pads, other electrical elements, and/or exposed insulating material along a top surface of a substrate comprising insulating material. In certain embodiments, a lens may be textured or faceted to improve light extraction, and/or a lens may contain or have coated thereon various materials such as lumiphors and/or scattering particles.

In certain embodiments, a light emitting apparatus including a first LED component and a second LED component as disclosed herein may include or be embodied in one or more LED packages. One or more LED packages may include one or more of the following features: a single leadframe arranged to conduct electrical power to the first LED component and the second LED component; a single reflector arranged to reflect at least a portion of light emanating from each of the first LED component and the second LED component; a single submount supporting the first LED component and the second LED component; and a single lens arranged to transmit at least a portion of light emanating from each of the first LED component and the second LED component.

In certain embodiments, a package includes a molded lens arranged to transmit light emitted by multiple LEDs. As known in the art, a mold including one or more cavities can be arranged over a substrate (or a panel of substrate material, from which multiple substrates may be singulated by sawing or other means) and LED chips arranged thereon, with the mold comprising a lens material and/or encapsulant in liquid form. In certain embodiments, a lens may be formed of liquid curable silicone, and LED chips may be embedded in liquid silicone, which is subsequently cured to form one or more lenses. Alternatively, a lens may be pre-molded and then affixed (e.g., with adhesives, thermal bonding, or any other suitable joining method) to a subassembly including a substrate with multiple LED chips mounted on or over the substrate.

In certain embodiments, a light emitting apparatus as disclosed herein (whether or not including one or more LED packages) may include at least one of the following items arranged to receive light from multiple LED components: a single lens; a single optical element; and a single reflector. In certain embodiments, a light emitting apparatus including multiple LED components may include at least one of the following items arranged to receive light from multiple LED components: multiple lenses; multiple optical elements; and multiple reflectors. Examples of optical elements include, but are not limited to elements arranged to affect light mixing, focusing, collimation, dispersion, and/or beam shaping.

In certain embodiments, a light emitting apparatus as described herein may include a first LED component arranged to generate a first spectral output including a first ratio of scotopic to photopic light (first S/P ratio); a second LED component arranged to generate a second spectral output including a second ratio of scotopic to photopic light (second S/P ratio) that differs from the first S/P ratio; and at least one control circuit arranged to permit transitioning between at least two predefined modes of operating the first LED component and the second LED component; wherein the at least two predefined modes include a first operating mode and a second operating mode; wherein the first operating mode is arranged to generate aggregated emissions from the light emitting apparatus according to a first aggregated emission profile including a first aggregated ratio of scotopic to photopic light (first aggregated S/P ratio) and a first aggregated chromaticity; wherein the second operating mode is arranged to generate aggregated emissions from the light emitting apparatus according to a second aggregated emission profile including a second aggregated ratio of scotopic to photopic light (second aggregated S/P ratio) and a second aggregated chromaticity; wherein the first aggregated S/P ratio is at least 20% greater (more preferably at least 50% greater, still more preferably at least 100% greater, and still more preferably at least 150% greater) than the second aggregated S/P ratio; and wherein the first aggregated chromaticity differs from the second aggregated chromaticity by no more than seven MacAdam ellipses (more preferably differing by no more than four MacAdam ellipses, still more preferably differing by no more than two MacAdam ellipses). In certain embodiments, a light apparatus may further include at least one element operatively coupled to the control circuit to activate transitioning between different modes of the at least two predefined modes, wherein the at least one element is selected from the group consisting of a user input element, a timer, and a sensor (e.g., a photosensor). In certain embodiments, more than two different modes may be predefined and separately selected.

Although first and second operating modes are described in connection with certain embodiments, it is to be appreciated that any desirable number of operating modes may be defined (e.g., pre-defined) and used for operation of a lighting device including multiple LED components as described herein.

In certain embodiments, transitioning between different operating modes having substantially different aggregate S/P ratios may be rapid in character, such as by abruptly or suddenly switching in from one operating mode to another. In certain embodiments, a change of at least 20% in aggregate S/P ratio may be effected in a single step. In certain embodiments, a change of at least 20% in aggregate S/P ratio may be effected in a relatively rapid manner within a time period of less than three seconds, less than two seconds, less than one second, or less than 0.5 seconds.

In certain embodiments, transitioning between different operating modes having substantially different aggregate S/P ratios may occur in a gradual manner. In certain embodiments, a change of at least 20% in aggregate S/P ratio may be effected in multiple intermediate transition steps—with such steps numbering preferably at least three, at least four, at least five, at least six, at least seven, at least eight, at least ten, at least twelve, at least sixteen, at least twenty-four, at least thirty-two, at least fifty, at least sixty-four, or at least a hundred. In certain embodiments, consecutive steps of adjustment may be equal in character; in other embodiments, consecutive steps may be unequal in character. In certain embodiments, a change of at least 20% in aggregate S/P ratio may be effected in a relatively gradual manner within a time period of at least about one of the following thresholds: five seconds, ten seconds, twenty seconds, thirty seconds, sixty seconds, ninety seconds, two minutes, three minutes, five minutes, ten minutes, fifteen minutes, thirty minutes, sixty minutes, hundred twenty minutes, or more, In certain embodiments, operating modes may be adjusted on a continual or substantially continual basis (e.g., without interruption for periods of more than about one minute, two minutes, or five minutes between adjustments). Substantially continuous adjustment of operating modes may optionally be performed responsive to one or more sensory inputs—such as by measurement of ambient light (e.g., using a photosensor) or responsive to receipt of one or more other sensory output signals.

In certain embodiments, a light emitting apparatus may comprising: a first LED component arranged to generate a first spectral output including a first ratio of scotopic to photopic light (first S/P ratio); a second LED component arranged to generate a second spectral output including a second ratio of scotopic to photopic light (second S/P ratio) that differs from the first S/P ratio; and at least one control circuit arranged to control operation of the first LED component according to a first dimming profile and to simultaneously control operation of the second LED component according to a second dimming profile, wherein the first dimming profile differs from the second dimming profile to effect increased color rendering index of aggregated emissions of the light emitting apparatus at maximum emissive output of the light emitting apparatus, and to effect increased aggregated S/P ratio of aggregated emissions of the light emitting apparatus at minimum emissive output of the light emitting apparatus. In certain embodiments, the minimum emissive output of the light emitting apparatus includes operation of both the first LED component and the second LED component. In certain embodiments, the aggregated S/P ratio of aggregated emissions of the light emitting apparatus at maximum emissive output of the light emitting apparatus is at least 50% greater (more preferably at least 100% greater, and still more preferably at least 150% greater) than the aggregated S/P ratio of aggregated emissions of the light emitting apparatus at minimum emissive output of the light emitting apparatus. In certain embodiments, a chromaticity of aggregated emissions of the light emitting apparatus at maximum emissive output of the light emitting apparatus differs by no more than seven MacAdam ellipses (more preferably differs by no more than four MacAdam ellipses, and still more preferably differs by no more than two MacAdam ellipses) from a chromaticity of aggregated emissions of the light emitting apparatus at minimum emissive output of the light emitting apparatus. In certain embodiments, the minimum emissive output of the light emitting apparatus may include operation of both a first LED component and a second LED component.

In certain embodiments, at least one control circuit as described herein may comprise a first control circuit arranged to control operation of the first LED component, and may comprise a second control circuit arranged to control operation of the second LED component. In certain embodiments, at least one control circuit as described herein may be configured to provide a linear relationship of aggregate current supplied to the first and second LED component versus aggregate dimming level for the light emitting apparatus, or at least one control circuit may be arranged to provide an exponential relationship of aggregate current supplied to the first and second LED component versus aggregate dimming level for the light emitting apparatus. In certain embodiments, at least one element may be operatively coupled to the at least one control circuit to affect dimming of the first LED component and the second LED component, wherein the at least one element is selected from the group consisting of a user input element, a timer, and a sensor (e.g., a photosensor). In certain embodiments, a solid state lighting apparatus may include at least one of the following features: a single leadframe arranged to conduct electrical power to the first LED component and the second LED component; a single reflector arranged to reflect at least a portion of light emanating from each of the first LED component and the second LED component; a single submount supporting the first LED component and the second LED component; and a single lens arranged to transmit at least a portion of light emanating from each of the first LED component and the second LED component.

As noted previously, providing multiple LED components having different S/P ratios in a single lighting device or apparatus wherein the LED may be separately controlled permits aggregated S/P ratio of the lighting device to be adjusted. In certain embodiments, adjustment of S/P ratio may be accompanied by small or minimal change in corrected color temperature (e.g., providing chromaticities that differ preferably by no more than seven MacAdam ellipses, preferably by no more than four MacAdam ellipses, or by some other desired threshold value).

In certain embodiments, an outdoor lamp (e.g., street lamp, security lamp, or the like) may include multiple LED components permitting adjustment of aggregated S/P ratio of the lamp.

In certain embodiments, an indoor light fixture or indoor lamp may include multiple LED components permitting adjustment of aggregated S/P ratio of the light fixture or lamp.

In certain embodiments, one or more vehicular exterior lamps (including but not limited to exterior lights such as headlamps of motorized or powered vehicles such as automobiles, buses, motorcycles, trains, airplanes, helicopters, etc.) may include multiple LED components permitting adjustment of aggregated S/P ratio of such lamps.

In certain embodiments, one or more vehicular interior lamps (including but not limited to interior lights for motorized or powered vehicles such as automobiles, buses, motorcycles, trains, airplanes, helicopters, etc.) may include multiple LED components permitting adjustment of aggregated S/P ratio of such lamps.

Various illustrative features are described below in connection with the accompanying figures.

FIG. 1A illustrates a solid state emitter package 100 that may embody or include one or more LED components as described herein. The emitter package 100 includes multiple (e.g., four) LED chips 150A-150D that may be separately controlled and that are supported by an insulating substrate 110 (e.g., preferably, but not necessarily. comprising ceramic material) having an upper surface 111, a lower surface 112, and side walls 113-116 extending between the upper surface 111 and the lower surface 112. Electrical traces 140 are arranged over the substrate 110, including multiple die attach pads 141A-141D and additional electrical elements 142A-142D arranged proximate to the die attach pads 141A-141D. Where the die attach pads 141A-141D are electrically conductive, the LED chips 150A-150D may be arranged with bottom side contacts thereof in electrical communication with the die attach pads 141A-141D, and with top side contacts thereof in electrical communication with the electrical elements 142A-142D by way of wirebonds 152. The die attach pads 141A-141D and electrical elements 142A-142D may comprise one or more metals patterned on (or in) the top surface 111 of the substrate 110. Gaps 145 may be provided between adjacent die attach pads 141A-141D and/or electrical elements 142A-142D to prevent undesired conductive electrical communication. In certain embodiments, die attach pads need not be electrically conductive, such as in cases where anode and cathode connections to a solid state emitter chip are both made with wirebonds. Optional elements that may be formed concurrently with the electrical traces 140 but not serve as part of any conductive path through the package 100 include a polarity or positional identifying mark 148 and chip singulation alignment marks 149-1, 149-2 (used during singulation, such as by sawing, of emitter packages or subassemblies thereof from a wafer or superassembly from which multiple emitter packages are formed). An insulating soldermask 147 (shown in greater detail in FIG. 1B) is patterned over peripheral portions of the electrical traces 140, and a molded lens 160 (e.g., including a raised or hemispherical portion 161 and a base portion 162) is arranged over the top surface 111 of the substrate 110 and is arranged to transmit at least a portion of light generated by the emitter chips 150A-150D.

LED chips 150A-150D of any suitable peak wavelength (e.g., color) may be used, and optionally arranged to stimulate emissions of one or more lumiphors (e.g., phosphors). Although the LED chips 150A-150D may be separately controlled, in certain embodiments groups of two or more LED chips 150A-150D or groups of LED chips may be controlled together in a groupwise fashion. As noted previously, the package 100 may embody one or more LED components, with each LED component comprising at least one LED chip 150A-150D (optionally multiple LED chips), with one or more LED chips 150A-150D optionally arranged to stimulate emissions of one or more lumiphoric materials. In certain embodiments, the solid state emitter package 100 may include two LED components, with each LED component including two LED chips 150A-150D. In certain embodiments, the solid state emitter package 100 may include one, two, three, or four LED components. Although four LED chips 150A-150D are illustrated in FIG. 1A, it is to be appreciated that a LED package may include any desirable number of LED chips, including groups of chips arranged in series, in parallel, or in series-parallel configurations.

FIG. 1B is a top plan view of a first subassembly 100-3 of the emitter package 100 illustrated in FIG. 1A, with the subassembly 100-3 lacking the lens 160 and representing the solder mask 147 with hatched lines for emphasis. As shown in FIG. 1B, the solder mask 147 is arranged over peripheral portions of the top side electrical traces 140 between the substrate edges 113-116 and a roughly circular window arranged below a raised portion 161 of the lens 160.

FIG. 1C is a top plan view of a second subassembly 100-1 of the emitter package 100 illustrated in FIG. 1A, with the subassembly 100-1 lacking a lens, solder mask, and LEDs, but with the traces 140 represented with hatched lines for emphasis. As shown in FIG. 1C, the electrical traces 140 extend peripherally outward beyond the roughly circular window defined in the solider mask 147 (illustrated in FIG. 1B), with optional alignment holes 143A-143D defined in peripheral portions of the die attach pads 141A-141D, and optional alignment holes 144A-144D defined in peripheral portions of the additional electrical elements 142A-142D. The various alignment holes 143A-143D, 144A-144D may be used during manufacture, for example, to promote alignment with electrically conductive vias (e.g., as shown in FIG. 1G) defined through the insulating substrate 110.

FIG. 1D is a top plan view of a third subassembly 100-2 of the emitter package 100 illustrated in FIG. 1A, with the subassembly 100-2 lacking a lens, and LEDs, but with the solder mask 147 represented with hatched lines for emphasis FIG. 1E is a bottom plan view of each of the emitter package 100 of FIG. 1A and the subassemblies of FIGS. 1B, 1C, and 1D. A bottom surface 112 of the substrate includes four anodes 121A-121D and four cathodes 122A-122D patterned thereon (e.g., as electrical traces), with one paired anode/cathode per quadrant. The separate anodes 121A-121D and cathodes 122A-122D enable separate control of the multiple LED chips 150A-150B if desired. Each anode 121A-121D may include an optional alignment hole 123A-123D and each cathode 122A-122D may include an optional alignment hole 124A-124D. The various anodes 121A-121D and cathodes 122A-122D are separated by gaps that may be filled with solder mask material sections 127-1, 127-2. A thermal element (e.g., thermal spreading element) 126 may be arranged along the bottom surface 112 between the solder mask material sections 127-1, 127-2 and generally underlapping the solid state emitters 150A-150D. The thickness of the thermal element 126 may be the same as or different from (e.g., thicker than) the anodes 121A-121D and cathodes 122A-122D. As show, the device 100 is devoid of any anode or cathode arranged on, or extending laterally beyond, any side wall 113-116 of the LED device 100.

FIG. 1F is a right side elevation view of the first subassembly 100-3 illustrated FIG. 1B, being devoid of a lens but showing solid state emitter chips 150B, 150D and wirebonds 152 arranged over a top surface 111 of the substrate 110.

FIG. 1G is a side cross-sectional view of the third subassembly 100-2 of FIG. 1D, taken along section lines "A"-"A" depicted in FIG. 1E. FIG. 1G illustrates electrically vias 125C, 125D defined through the substrate 110 between the top and bottom surfaces 111, 112, and arranged to provide electrical communication between top side traces (die attach pads) 141C, 14D and bottom side traces (anodes) 121C, 121D. The thermal element 112 is further illustrated along the bottom surface 112 of the substrate 110. As shown in FIG. 1G, the upper solder mask 147 may extend laterally past the top side traces 140 but not quite to side edges 113, 115 of the substrate 110.

FIG. 1H is an exploded right side elevation view of the emitter package 100, separately depicting the lens 160 registered with the first subassembly 100-3 of FIG. 1B. FIG. 1I is another perspective view of the emitter package 100. Although FIGS. 1H-1I illustrate the lens 160 as including a hemispherical central raised portion 161, it is to be appreciated that any suitable lens shape (including raised, flat, or recessed shapes) may be provided in various embodiments. The lens 160 is preferably molded and may either be molded in place over the emitter chips 150A-150D and substrate 110, or may be pre-molded and then affixed to a subassembly including the substrate 110 and emitter chips 150A-150D.

FIG. 2A illustrates a lighting apparatus 200 including first and second LED components 201, 202 supported in or on a substrate or other body structure 209. The first and the second LED components 201, 202 each include at least one LED chip (optionally multiple LED chips 203A-203B, 204A-204B), wherein any one or more LED chips 203A-203B, 204A-204B may be optionally arranged to stimulate emissions of one or more lumiphoric materials (not shown). Although FIG. 2A illustrates two LED chips 203A-203B, 204A-204B as being associated with each LED component 201, 202, it is to be appreciated that any suitable number or more (e.g., one, two, three, four, five, six, etc.) LED chips may be associated with one or more LED component in certain embodiments. The first and second LED components 201, 202 may embody any suitable LED components, features, and/or capabilities as described herein, and are preferably separately controllable. In certain embodiments, each LED within a single LED component may be individually controlled, or groups of two or more LEDs within a single component may be controlled as a group.

Figure 2B:
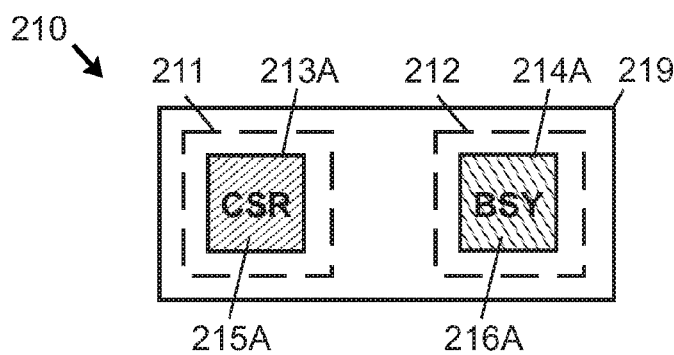

FIG. 2B illustrates a lighting apparatus 210 including first and second LED components 211, 212 supported in or on a substrate or other body structure 219. The first LED component 211 includes a first (e.g., cyan) LED 213A arranged to stimulate emissions of at least one first (e.g., red) lumiphoric material 215A, and the second LED component 212 includes a second (e.g., blue) LED 214A arranged to stimulate emissions of at least one second (e.g., yellow) lumiphoric material 216A. The first and second LED components 211, 212 may embody any suitable LED components, features, and/or capabilities as described herein, and are preferably separately controllable. The first and second LED components 211, 212 may embody any suitable LED components, features, and/or capabilities as described herein, and are preferably separately controllable. In certain embodiments, additional LEDs and/or lumiphors may be associated with one or more of the LED components 211, 212, and/or one or more additional LED components may be provided.

Figure 2C:
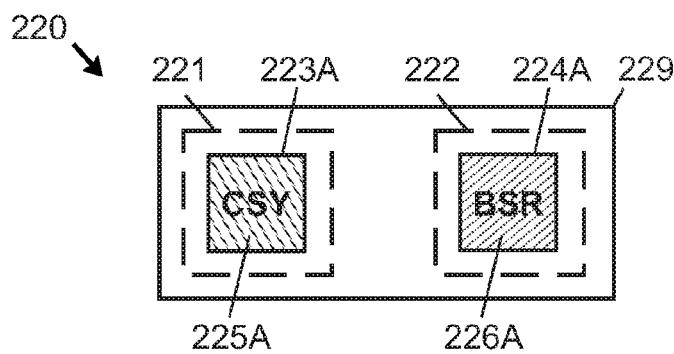

FIG. 2C illustrates a lighting apparatus 220 including first and second LED components 221, 222 supported in or on a substrate or other body structure 229. The first LED component 221 includes a first (e.g., cyan) LED 223A arranged to stimulate emissions of at least one first (e.g., yellow) lumiphoric material 225A, and the second LED component 222 includes a second (e.g., blue) LED 224A arranged to stimulate emissions of at least one second (e.g., red) lumiphoric material 226A. The first and second LED components 221, 222 may embody any suitable LED components, features, and/or capabilities as described herein, and are preferably separately controllable. In certain embodiments, additional LEDs and/or lumiphors may be associated with one or more of the LED components 221, 222, and/or one or more additional LED components may be provided.

Figure 2D:
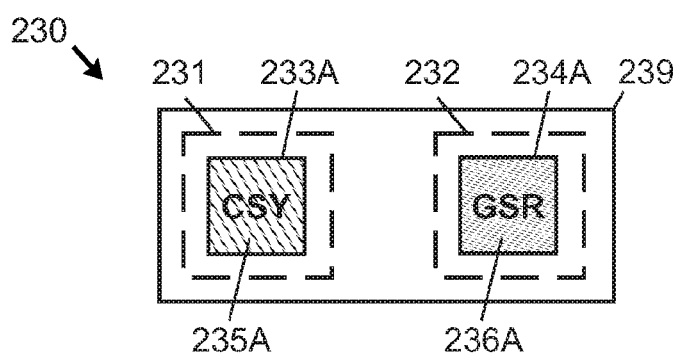

FIG. 2D illustrates a lighting apparatus 230 including first and second LED components 231, 232 supported in or on a substrate or other body structure 239. The first LED component 231 includes a first (e.g., cyan) LED 233A arranged to stimulate emissions of at least one first (e.g., yellow) lumiphoric material 235A, and the second LED component 232 includes a second (e.g., green) LED 234A arranged to stimulate emissions of at least one second (e.g., red) lumiphoric material 236A. The first and second LED components 231, 232 may embody any suitable LED components, features, and/or capabilities as described herein, and are preferably separately controllable. In certain embodiments, additional LEDs and/or lumiphors may be associated with one or more of the LED components 231, 232, and/or one or more additional LED components may be provided.

Figure 2E:
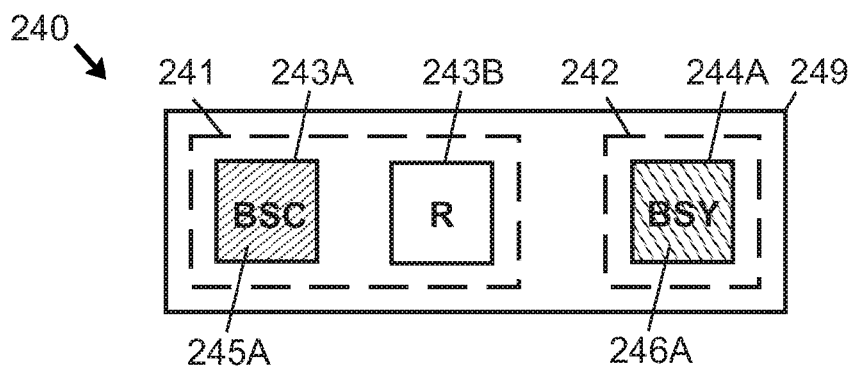

FIG. 2E illustrates a lighting apparatus 240 including first and second LED components 241, 242 supported in or on a substrate or other body structure 249. The first LED component 241 includes a first (e.g., blue) LED 243A arranged to stimulate emissions of at least one first (e.g., cyan) lumiphoric material 245A, in combination with an additional (e.g., red) LED 243B. The second LED component 242 includes a second (e.g., green) LED 244A arranged to stimulate emissions of at least one second (e.g., red) lumiphoric material 246A. The first and second LED components 241, 242 may embody any suitable LED components, features, and/or capabilities as described herein, and are preferably separately controllable.

In certain embodiments, additional LEDs and/or lumiphors may be associated with one or more of the LED components 241, 242, and/or one or more additional LED components may be provided.

Figure 2F:
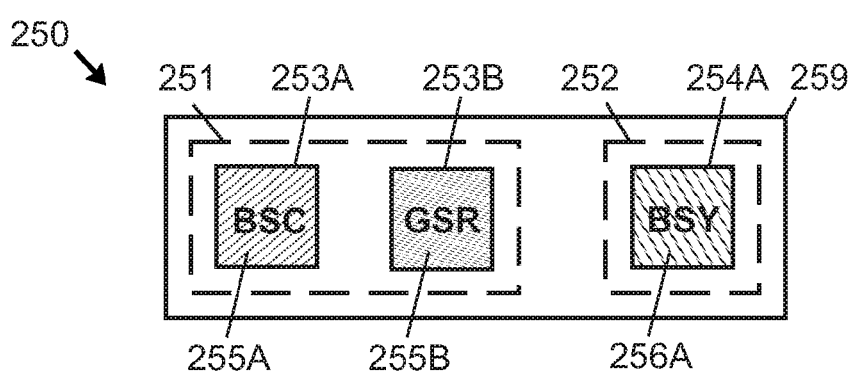

FIG. 2F illustrates a lighting apparatus 250 including first and second LED components 251, 252 supported in or on a substrate or other body structure 259. The first LED component 251 includes a first (e.g., blue) LED 253A arranged to stimulate emissions of at least one first (e.g., cyan) lumiphoric material 255A, in combination with an additional (e.g., green) LED 253B arranged to stimulate emissions of at least one additional (e.g., red) lumiphoric material 255B. The second LED component 252 includes a second (e.g., blue) LED 254A arranged to stimulate emissions of at least one second (e.g., yellow) lumiphoric material 256A. The first and second LED components 251, 252 may embody any suitable LED components, features, and/or capabilities as described herein, and are preferably separately controllable. In certain embodiments, additional LEDs and/or lumiphors may be associated with one or more of the LED components 251, 252, and/or one or more additional LED components may be provided.

Figure 2G:
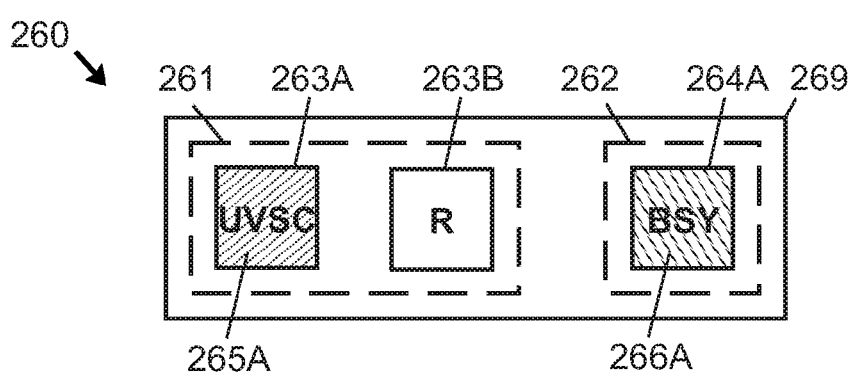

FIG. 2G illustrates a lighting apparatus 260 including first and second LED components 261, 262 supported in or on a substrate or other body structure 269. The first LED component 261 includes a first (e.g., UV) LED 263A arranged to stimulate emissions of at least one first (e.g., cyan) lumiphoric material 265A, in combination with an additional (e.g., red) LED 263B. The second LED component 262 includes a second (e.g., blue) LED 264A arranged to stimulate emissions of at least one second (e.g., yellow) lumiphoric material 266A. The first and second LED components 261, 262 may embody any suitable LED components, features, and/or capabilities as described herein, and are preferably separately controllable. In certain embodiments, additional LEDs and/or lumiphors may be associated with one or more of the LED components 261, 262, and/or one or more additional LED components may be provided.

Figure 2H:
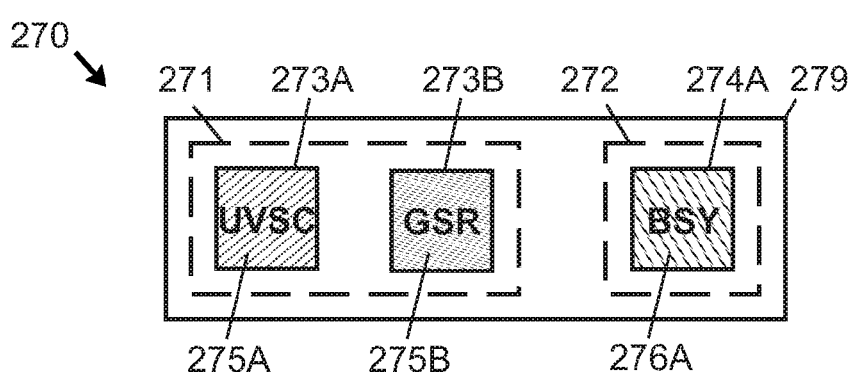

FIG. 2H illustrates a lighting apparatus 270 including first and second LED components 271, 272 supported in or on a substrate or other body structure 279. The first LED component 271 includes a first (e.g., UV) LED 273A arranged to stimulate emissions of at least one first (e.g., cyan) lumiphoric material 275A, in combination with an additional (e.g., green) LED 273B arranged to stimulate emissions of at least one additional (e.g., red) lumiphoric material 275B. The second LED component 272 includes a second (e.g., blue) LED 274A arranged to stimulate emissions of at least one second (e.g., yellow) lumiphoric material 276A. The first and second LED components 271, 272 may embody any suitable LED components, features, and/or capabilities as described herein, and are preferably separately controllable. In certain embodiments, additional LEDs and/or lumiphors may be associated with one or more of the LED components 271, 272, and/or one or more additional LED components may be provided.

FIG. 3 illustrates interconnections between various components of a light emitting apparatus 300 including first and second LED components 301, 302 arranged in series, with at least one control circuit 310 arranged to control modulation of current and/or duty cycle of the LED components 301, 302 using controllable bypass and/or shunt elements 311, 312. The at least one control circuit 310 may be controlled responsive to one or more user input elements 306, one or more timer elements 307, and/or one or more sensor elements 308 (e.g., temperature sensing element, photosensors, etc.). Various components of the light emitting apparatus 300 may be supported by, arranged on, or arranged in electrical communication portions of a substrate or support element 309. In operation, current is applied to the lighting apparatus 300 between anode 321A and cathode 321B. Supply of current to, and/or duty cycle of, a first LED component 301 may be controlled with a first controllable bypass or shunt element 311. Similarly, supply of current to, and/or duty cycle of, a second LED component 302 may be controlled with a second controllable bypass or shunt element 312, with the second LED component 302 arranged in series with the first LED component 301. Each of the first and second controllable bypass or shunt elements 311, 312 may be controlled by at least one control circuit 310, optionally in response one or more user input elements 306, one or more timer elements 307, and/or one or more sensor elements 308.

FIG. 4 illustrates interconnections between various components of a light emitting apparatus 400 including first and second LED components 401, 402 arranged in parallel, with at least one control circuit 410 (e.g., optionally including control circuit portions 410A, 410B) arranged to control modulation of current and/or duty cycle of the LED components 401, 402 using controllable bypass and/or shunt elements 411, 412. The at least one control circuit 410 may be controlled responsive to one or more user input elements 406, one or more timer elements 407, and/or one or more sensor elements 408. Various components of the light emitting apparatus 400 may be supported by, arranged on, or arranged in electrical communication portions of a substrate or support element 409. In operation, current may be supplied to the first LED component 401 via a first anode 421A and cathode 421B, wherein supply of current to, and/or duty cycle of, the first LED component 401 may be modulated with a first controllable bypass or shunt element 411. In a like manner, current may be supplied to the second LED component 402 via a second anode 422A and cathode 422B, wherein supply of current to, and/or duty cycle of, the second LED component 402 may be modulated with a second controllable bypass or shunt element 412. The first and second controllable bypass or shunt elements 411, 412 may be controlled by at least one control circuit 410 (optionally with dedicated portions 410A, 410B), optionally in response one or more user input elements 406, one or more timer elements 407, and/or one or more sensor elements 408.

FIG. 5 illustrates a lighting apparatus (e.g., light fixture) 510 according to at least one embodiment. The apparatus 500 includes a substrate or mounting plate 575 to which multiple solid state emitter (e.g., LED) lamps 570-1 to 570-6 (with at least some lamps 570-1 to 570-6 optionally embodying a multi-chip lamp such as a multi-chip LED package) are attached, wherein each lamp 570-1 to 570-6 embodies at least on LED component as described herein. Although the mounting plate 575 is illustrated as having a circular shape, the mounting plate may be provided in any suitable shape or configuration (including non-planar and curvilinear configurations). Different solid state emitter chips within a single multi-chip solid state emitter lamp may be configured to emit the same or different colors (e.g., wavelengths) of light. With specific reference to a first solid state lamp 570-1, each solid state lamp 570-1 to 570-6 may include multiple solid state emitters (e.g., LEDs) 574A-574C preferably arranged on a single submount 561. Although FIG. 5 illustrates four solid state emitter chips as being associated with each multi-chip solid state lamp 570-1 to 570-6, it is to be appreciated that any suitable number of solid state emitter chips may be associated with each multi-chip solid state lamp 570-1 to 570-6, and the number of solid state emitter chips associated with different (e.g., multi-chip) solid state lamps may be different. Each solid state lamp in a single fixture 510 may be substantially identical to one another, or solid state lamps with different output characteristics may be intentionally provided in a single fixture 510.

The solid state lamps 570-1 to 570-6 may be grouped on the mounting plate 575 in clusters or other arrangements so that the light fixture 510 outputs a desired pattern of light. In certain embodiments, at least one state emitter lamp associated with a single fixture 510 includes a lumiphor-converted light emitting component (e.g., BSY, BSC, CSR, CSY, GSR, UVSC, etc. emitter). In certain embodiments, multiple LED components having different S/P ratios in the apparatus 510 may be separately controlled separately, to permit aggregated S/P ratio of the lighting device to be adjusted, preferably wherein such adjustment of S/P ratio may be accompanied by small or minimal change in corrected color temperature.

With continued reference to FIG. 5, the light fixture 510 may include one or more control circuit components 580 arranged to operate the lamps 570-1 to 570-6 by independently applying currents and/or adjusting duty cycle of respective LED components. In certain embodiments, individual solid state chip 564A-564D in various lamps 570-1 to 570-6 may be configured to be individually addressed by the control circuit 580. In certain embodiments, the lighting apparatus 510 may be self-ballasted. In certain embodiments, a control circuit 580 may include a current supply circuit configured to independently apply an on-state drive current to each individual solid state chip responsive to a control signal, and may include one or more control elements configured to selectively provide control signals to the current supply circuit. As solid state emitters (e.g., LEDs) are current-controlled devices, the intensity of the light emitted from an electrically activated solid state emitter (e.g., LED) is related to the amount of current with which the device is driven. A common method for controlling the current driven through an LED to achieve desired intensity and/or color mixing is a Pulse Width Modulation (PWM) scheme, which alternately pulses the LEDs to a full current "ON" state followed by a zero current "OFF" state. The control circuit 580 may be configured to control the current driven through the solid state emitter chips 564A-564D associated with the lamps 570-1 to 570-6 using one or more control schemes known in the art. The control circuit 580 may be attached to an opposite or back surface of the mounting plate 575, or may be provided in an enclosure or other structure (not shown) that is segregated from the lighting device 500.

While not illustrated in FIG. 5, the light fixture 510 a may further include one or more heat spreading components and/or heatsinks for spreading and/or removing heat emitted by solid state emitter chips 564A-564D associated with the lamps 570-1 to 570-6. For example, a heat spreading component may include a sheet of thermally conductive material configured to conduct heat generated by the solid state emitter chips 564A-564D of the light fixture 510 and spread the conducted heat over the area of the mounting plate 575 to reduce thermal stratification in the light fixture 510. A heat spreading component may be embodied in a solid material, a honeycomb or other mesh material, an anisotropic thermally conductive material (e.g., graphite), one or more fins, and/or other materials or configurations.

FIG. 6 illustrates a lighting apparatus (e.g., light fixture) 610 according to at least one embodiment. The apparatus includes multiple solid state emitter lamps 600A-600X (which may optionally be embodied in solid state emitter packages) each including multiple solid state light emitting chips (e.g., LEDs) 648A-648X—with each lamp 600A-600X embodying one or more LED components as described previously herein. Each lamp 600A-600X preferably includes multiple emitters arranged to generate spectral output including different peak wavelengths. (Although six lamps 600A-600X are shown, it is to be appreciated that any desirable number of clusters may be provided, as represented by the variable "X"). In certain embodiments, each lamp 600A-600X may embody an individually temperature compensated lamp. Each lamp 600A-600X may preferably (but not necessarily) include a single submount 642A-642X to which the multiple LEDs 648A-648X are mounted or otherwise supported. The lighting device 610 includes a body structure or substrate 611 to which each lamp 600A-600X may be mounted, with each cluster 600A-600X optionally being arranged in conductive thermal communication with a single heatsink 618 and further arranged to emit light to be diffused by a single diffuser or other optical element 617. The lighting device 610 is preferably self-ballasted. Power may be supplied to the lighting device via contacts 616 (e.g., as may be embodied in a single anode and single cathode, or multiple anodes and cathodes). A power conditioning circuit 612 may provide AC/DC conversion utility, voltage conversion, and/or filtering utility. At least control circuit 614 may be provided to control operation (e.g., control dimming) of one or more lamps 600A-600X or subgroups thereof. In certain embodiments, each lamp 600A-600X may include one or more emitters of a first LED component and one or more emitters of a second LED component. In other embodiments, each lamp 600A-600X may include emitters of either a first LED component or a second LED component, but not emitters of both LED components within the same specific lamp 600A-600X. In one or more photosensors or light sensing elements (not shown) may be arranged to receive emissions from one or more clusters 600A-600X, with an output signal of the one or more light sensing elements being used to control or adjust operation of the clusters 600A-600X, such as to ensure attainment of a desired output color or output color temperature by the clusters 600A-600X. In certain embodiments, multiple LED components having different S/P ratios in the apparatus 610 may be separately controlled separately, to permit aggregated S/P ratio of the lighting device to be adjusted, preferably wherein such adjustment of S/P ratio may be accompanied by small or minimal change in corrected color temperature.

FIG. 7A includes superimposed plots of current versus dimming percentage (more precisely operating percentage) for first and second LED components, together with total current versus dimming percentage (series [C]) for a lighting apparatus that provides linear dimming response, obtained by simulation of a light emitting apparatus including a first LED component that includes a blue shifted (yellow+red) emitter (series [A]), and including a second LED component that includes a cyan shifted red emitter (series [B]). As shown in FIG. 7A, for operation between 0% to 20% (x-axis), current is supplied exclusively to the second LED component, whereas for operation from 20% to 100%, current is supplied to both the first LED component and the second LED component. As shown in FIG. 7A, slope of current versus operating percentage of the second LED component is maximum at operation between 0% and nearly 20% but declines thereafter, whereas slope of current versus operating percentage of the first LED component increases steadily from 20% to 100%, yielding a linear response of current versus operating percentage for the LED components in combination. FIG. 7B is a table including simulation data supporting the plots depicted in FIG. 7A.

FIG. 8A includes superimposed plots of current versus dimming percentage (more precisely operating percentage) for first and second LED components, together with total current versus dimming percentage (series [C]) for a lighting apparatus that provides exponential dimming response, obtained by simulation of a light emitting apparatus including a first LED component that includes a blue shifted (yellow+red) emitter (series [A]), and including a second LED component that includes a cyan shifted red emitter (series [B]). As shown in FIG. 8A, for operation between 0% to 20% (x-axis), current is supplied exclusively to the second LED component, whereas for operation from 20% to 100%, current is supplied to both the first LED component and the second LED component. As shown in FIG. 8A, slope of current versus operating percentage of the second LED component is maximized at some intermediate value between approximately 30%-60% but declines thereafter (while remaining positive), whereas slope of current versus operating percentage of the first LED component increases steadily from 20% to 100%, yielding an exponential response of current versus operating percentage for the LED components in combination. FIG. 8B is a table including simulation data supporting the plots depicted in FIG. 8A.

Although FIGS. 7A and 8A illustrate two dimming schemes for apportioning current between two LED components, it is to be appreciated that any desired dimming scheme known in the art for apportioning current between two or more LED components may be used. In certain embodiments, multiple LED components of a light emitting apparatus may be simultaneously controlled with different dimming profiles to effect increased color rendering at high or maximum emissive output of the apparatus, and to effect increased aggregated S/P ratio at low or minimum emissive output of the apparatus.

FIGS. 9A-9B illustrate an outdoor floodlight (e.g., street or roadway lamp) 900 that may include multiple LED components as described herein. The lamp 900 includes a housing 910 supported by an elongate pole 901 or other support. Multiple LED modules 931-1, 931-2, 931-3 each including multiple LED components 918A, 918B (i.e., embodying LED components as disclosed herein) are arranged along a lower surface 911 of the lamp 900 between the pole 901 and an end cap 912. The LED modules 931-1, 931-2, 931-3 are arranged proximate to an air gap 914 permitting heat to be dissipated to a heat spreader or heat sink 926 (arranged along the upper surface 913) and transferred to an ambient environment.

FIG. 10 is a schematic diagram of an interior space 1000 with a light fixture 1018 that may including multiple LED components as described herein arranged to illuminate an indoor environment 1001. The interior space 1001 may be bounded by walls 1003 and may include a window 1002 arranged to admit ambient light $L_A$. One or more objects (e.g., a table 1004) may be arranged in the interior space 1001. One or more sensors 1030 (e.g., photosensors) may be arranged in communicate sensory information (signals) to a control element 1035 arranged to control or affect operation of the light fixture 1018, which outputs generated light $L_G$. One or more user input elements 1050 may also be arranged to communicate user input signals to the control element 1035 to affect operation of the fixture 1018. In operation, ambient light $L_A$ may be transmitted through the window 1002 into the indoor environment 1001. Such ambient light $L_A$ may optionally combine with generated light $L_G$, may optionally reflect from one or more surfaces or objects (e.g., table 1004) and impinge on the one or more sensors 1030. In certain embodiments, multiple photosensors may be used. The sensor(s) 1030 may be used to sense light level and/or color point, and output(s) of the sensor(s) 1030 may be supplied to the control element 1035 to affect operation of the light fixture 1018 (e.g., to responsively adjust output level (intensity)/dimming and/or color point of emissions generated by the fixture 1018).

FIG. 11 illustrates an interior lamp (e.g., desk lamp or table lamp) 1100 that may include multiple LED components as described herein. The lamp 1100 includes an arm 1154 extending between a base 1151 and a lamp head 1160 that includes the LED components 1168. The base 1151 may include a user input element 1152 and/or one or more sensor elements 1155 (e.g., photosensors) arranged to control operation (e.g., output intensity/dimming, and/or color point of aggregated emissions) of the LED components 1168, FIG. 12 is a simplified perspective view of a motor vehicle (i.e., automobile) 1200 including headlamps 1218-1, 1218-2 that may each include multiple LED components as described herein for lighting an environment and/or surface external to the vehicle 1200, and including interior lamps 1228-1, 1228-2 that that may each include multiple LED components as described herein for lighting the interior 1225 of the vehicle 1200.

Embodiments as disclosed herein may provide one or more of the following beneficial technical effects: permitting selective attainment of high S/P ratio and high CRI using a single lighting device; permitting adjustment of S/P ratio without dramatically altering CCT; providing lighting devices with high luminous efficacy and enhanced energy efficiency; increasing light output useful to humans when an lighting apparatus is subject to dimmed operation; and enhancing flexibility of operation of lighting devices.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Various combinations and sub-combinations of the structures described herein are contemplated and will be apparent to a skilled person having knowledge of this disclosure. Any of the various features and elements as disclosed herein may be combined with one or more other disclosed features and elements unless indicated to the contrary herein. Correspondingly, the invention as hereinafter claimed is intended to be broadly construed and interpreted, as including all such variations, modifications and alternative embodiments, within its scope and including equivalents of the claims.

What is claimed is:
1. A light emitting apparatus comprising:
a first LED component arranged to generate a first spectral output including a first ratio of scotopic to photopic light (first S/P ratio), and including a first chromaticity; and
a second LED component arranged to generate a second spectral output including a second ratio of scotopic to photopic light (second S/P ratio), and including a second chromaticity;
wherein the first chromaticity and the second chromaticity differ by no more than seven MacAdam ellipses; and
wherein the first S/P ratio is at least 20% greater than the second S/P ratio.
2. A light emitting apparatus according to claim 1, wherein the first chromaticity and the second chromaticity differ by no more than four MacAdam ellipses.
3. A light emitting apparatus according to claim 1, wherein the first S/P ratio is at least 50% greater than the second S/P ratio.

4. A light emitting apparatus according to claim 1, wherein the first S/P ratio is at least 100% greater than the second S/P ratio.

5. A light emitting apparatus according to claim 1, wherein the first LED component comprises a first LED including a first peak wavelength, the second LED component comprises a second LED including a second peak wavelength, and the first peak wavelength differs from the second peak wavelength by at least 10 nm.

6. A light emitting apparatus according to claim 1, wherein the first LED component comprises a first LED arranged to stimulate emissions of at least one first lumiphor, wherein either the first LED or the at least one first lumiphor comprises a peak wavelength in a range of from 481 nm to 505 nm.

7. A light emitting apparatus according to claim 1, wherein:
the first LED component comprises a first LED including a peak wavelength in a range of from 481 nm to 505 nm arranged to stimulate emissions of at least one first lumiphor including a peak wavelength in a range of from 591 nm to 690 nm; and
the second LED component comprises a second LED including a peak wavelength in a range of from 430 nm to 480 nm arranged to stimulate emissions of at least one second lumiphor including a peak wavelength in a range of from 561 nm to 590 nm.

8. A light emitting apparatus according to claim 1, wherein:
the first LED component comprises a first LED including a peak wavelength in a range of from 430 nm to 480 nm arranged to stimulate emissions of at least one first lumiphor including a peak wavelength in a range of from 481 nm to 505 nm, and the first LED component comprises an additional LED including a peak wavelength in a range of from 591 nm to 690 nm; and
the second LED component comprises a second LED including a peak wavelength in a range of from 430 nm to 480 nm arranged to stimulate emissions of at least one second lumiphor including a peak wavelength in a range of from 561 nm to 590 nm.

9. A light emitting apparatus according to claim 1, wherein:
the first LED component comprises a first LED including a peak wavelength in a range of from 430 nm to 480 nm arranged to stimulate emissions of at least one first lumiphor including a peak wavelength in a range of from 481 nm to 505 nm, and comprises an additional LED including a peak wavelength in a range of from 506 nm to 560 nm arranged to stimulate emissions of at least one additional lumiphor including a peak wavelength in a range of from 591 nm to 690 nm; and
the second LED component comprises a second LED including a peak wavelength in a range of from 430 nm to 480 nm arranged to stimulate emissions of at least one second lumiphor including a peak wavelength in a range of from 561 nm to 590 nm.

10. A light emitting apparatus according to claim 1, wherein:
the first LED component comprises a first LED including a peak wavelength in a range of from 380 nm to 425 nm arranged to stimulate emissions of at least one first lumiphor including a peak wavelength in a range of from 481 nm to 505 nm, and comprises an additional LED including a peak wavelength in a range of from 591 nm to 690 nm; and
the second LED component comprises a second LED including a peak wavelength in a range of from 430 nm to 480 nm arranged to stimulate emissions of at least one second lumiphor including a peak wavelength in a range of from 561 nm to 590 nm.

11. A light emitting apparatus according to claim 1, wherein:
the first LED component comprises a first LED including a peak wavelength in a range of from 380 nm to 425 nm arranged to stimulate emissions of at least one first lumiphor including a peak wavelength in a range of from 481 nm to 505 nm, and the first LED component comprises an additional LED including a peak wavelength in a range of from 506 nm to 560 nm arranged to stimulate emissions of at least one additional lumiphor including a peak wavelength in a range of from 591 nm to 690 nm; and
the second LED component comprises a second LED including a peak wavelength in a range of from 430 nm to 480 nm arranged to stimulate emissions of at least one second lumiphor including a peak wavelength in a range of from 561 nm to 590 nm.

12. A light emitting apparatus according to claim 1, wherein:
the first LED component comprises a first LED including a peak wavelength in a range of from 481 nm to 505 nm arranged to stimulate emissions of at least one first lumiphor including a peak wavelength in a range of from 561 nm to 590 nm; and
the second LED component comprises a second LED including a peak wavelength in a range of from 430 nm to 480 nm arranged to stimulate emissions of at least one second lumiphor including a peak wavelength in a range of from 591 nm to 690 nm.

13. A light emitting apparatus according to claim 1, wherein:
the first LED component comprises a first LED including a peak wavelength in a range of from 481 nm to 505 nm arranged to stimulate emissions of at least one first lumiphor including a peak wavelength in a range of from 561 nm to 590 nm; and
the second LED component comprises a second LED including a peak wavelength in a range of from 506 nm to 560 nm arranged to stimulate emissions of at least one second lumiphor including a peak wavelength in a range of from 591 nm to 690 nm.

14. A light emitting apparatus according to claim 1, further comprising at least one control circuit arranged to independently supply current to the first LED component and the second LED component.

15. A light emitting apparatus according to claim 14, further comprising at least one element operatively coupled to the at least one control circuit to affect dimming of the first LED component and the second LED component, wherein the at least one element is selected from the group consisting of a user input element, a timer, and a photosensor.

16. A light emitting apparatus according to claim 1, comprising at least one of the following features:
a single leadframe arranged to conduct electrical power to the first LED component and the second LED component;
a single reflector arranged to reflect at least a portion of light emanating from each of the first LED component and the second LED component;
a single submount supporting the first LED component and the second LED component; and
a single lens arranged to transmit at least a portion of light emanating from each of the first LED component and the second LED component.

17. A light emitting apparatus according to claim 1, wherein each of the first LED component and the second LED component is separately arranged to output light having a color temperature in a range of from 2700K to 5000K.

18. A method comprising illuminating an object, a space, or an environment, utilizing a light emitting apparatus according to claim 1.

19. A light emitting apparatus comprising:
a first LED component arranged to generate a first spectral output including a first ratio of scotopic to photopic light (first S/P ratio);
a second LED component arranged to generate a second spectral output including a second ratio of scotopic to photopic light (second S/P ratio) that differs from the first S/P ratio; and
at least one control circuit arranged to permit transitioning between at least two predefined modes of operating the first LED component and the second LED component;
wherein:
the at least two predefined modes include a first operating mode and a second operating mode;
the first operating mode is arranged to generate aggregated emissions from the light emitting apparatus according to a first aggregated emission profile including a first aggregated ratio of scotopic to photopic light (first aggregated S/P ratio) and a first aggregated chromaticity;
the second operating mode is arranged to generate aggregated emissions from the light emitting apparatus according to a second aggregated emission profile including a second aggregated ratio of scotopic to photopic light (second aggregated S/P ratio) and a second aggregated chromaticity;
the first aggregated S/P ratio is at least 20% greater than the second aggregated S/P ratio; and
the first aggregated chromaticity differs from the second aggregated chromaticity by no more than seven MacAdam ellipses.

20. A light emitting apparatus according to claim 19, wherein the first aggregated S/P ratio is at least 50% greater than the second aggregated S/P ratio.

21. A light emitting apparatus according to claim 19, wherein the first aggregated S/P ratio is at least 100% greater than the second aggregated S/P ratio.

22. A light emitting apparatus according to claim 19, wherein the first aggregated chromaticity differs from the second aggregated chromaticity by no more than four MacAdam ellipses.

23. A light emitting apparatus according to claim 19, wherein the at least two predefined modes includes three or more predefined modes.

24. A light emitting apparatus according to claim 19, wherein the at least one control circuit is arranged to permit gradual transitioning from the first operating mode to the second operating mode according to at least one of the following conditions (i) or (ii): (i) over a time period of at least about ten seconds, and (ii) utilizing at least four intermediate transition steps.

25. A light emitting apparatus according to claim 19, wherein each of the first LED component and the second LED component is separately arranged to output light having a color temperature in a range of from 2700K to 5000K.

26. A light emitting apparatus according to claim 19, wherein the first LED component comprises a first LED including a first peak wavelength, the second LED component comprises a second LED including a second peak wavelength, and the first peak wavelength differs from the second peak wavelength by at least 10 nm.

27. A light emitting apparatus according to claim 19, wherein the first LED component comprises a first LED arranged to stimulate emissions of at least one first lumiphor, wherein either the first LED or the at least one first lumiphor comprises a peak wavelength in a range of from 481 nm to 505 nm.

28. A light emitting apparatus according to claim 19, further comprising at least one element operatively coupled to the control circuit to activate switching between different modes of the at least two predefined modes, wherein the at least one element is selected from the group consisting of a user input element, a timer, and a photosensor.

29. A light emitting apparatus according to claim 19, comprising at least one of the following features:
a single leadframe arranged to conduct electrical power to the first LED component and the second LED component;
a single reflector arranged to reflect at least a portion of light emanating from each of the first LED component and the second LED component;
a single submount supporting the first LED component and the second LED component; and
a single lens arranged to transmit at least a portion of light emanating from each of the first LED component and the second LED component.

30. A method comprising illuminating an object, a space, or an environment, utilizing a light emitting apparatus according to claim 19.

31. A light emitting apparatus comprising:
a first LED component arranged to generate a first spectral output including a first ratio of scotopic to photopic light (first S/P ratio);
a second LED component arranged to generate a second spectral output including a second ratio of scotopic to photopic light (second S/P ratio) that differs from the first S/P ratio; and
at least one control circuit arranged to control operation of the first LED component according to a first dimming profile and to simultaneously control operation of the second LED component according to a second dimming profile, wherein the first dimming profile differs from the second dimming profile to effect increased color rendering index of aggregated emissions of the light emitting apparatus at maximum emissive output of the light emitting apparatus, and to effect increased aggregated S/P ratio of aggregated emissions of the light emitting apparatus at minimum emissive output of the light emitting apparatus.

32. A light emitting apparatus according to claim 31, wherein the at least one control circuit comprises a first control circuit arranged to control operation of the first LED component, and comprises a second control circuit arranged to control operation of the second LED component.

33. A light emitting apparatus according to claim 31, wherein the at least one control circuit is configured to provide a linear relationship of aggregate current supplied to the first LED component and the second LED component versus aggregate dimming level for the light emitting apparatus.

34. A light emitting apparatus according to claim 31, wherein the at least one control circuit is configured to provide an exponential relationship of aggregate current supplied to the first LED component and the second LED component versus aggregate dimming level for the light emitting apparatus.

35. A light emitting apparatus according to claim 31, wherein the minimum emissive output of the light emitting apparatus includes operation of both the first LED component and the second LED component.

36. A light emitting apparatus according to claim 31, wherein the aggregated S/P ratio of aggregated emissions of the light emitting apparatus at maximum emissive output of the light emitting apparatus is at least 50% greater than the aggregated S/P ratio of aggregated emissions of the light emitting apparatus at minimum emissive output of the light emitting apparatus.

37. A light emitting apparatus according to claim 31, wherein the aggregated S/P ratio of aggregated emissions of the light emitting apparatus at maximum emissive output of the light emitting apparatus is at least 100% greater than the aggregated S/P ratio of aggregated emissions of the light emitting apparatus at minimum emissive output of the light emitting apparatus.

38. A light emitting apparatus according to claim 31, wherein a chromaticity of aggregated emissions of the light emitting apparatus at maximum emissive output of the light emitting apparatus differs by no more than seven MacAdam ellipses from a chromaticity of aggregated emissions of the light emitting apparatus at minimum emissive output of the light emitting apparatus.

39. A light emitting apparatus according to claim 31, wherein each of the first LED component and the second LED component is separately arranged to output light having a color temperature in a range of from 2700K to 5000K.

40. A light emitting apparatus according to claim 31, further comprising at least one element operatively coupled to the at least one control circuit to affect dimming of the first LED component and the second LED component, wherein the at least one element is selected from the group consisting of a user input element, a timer, and a photosensor.

41. A light emitting apparatus according to claim 31, comprising at least one of the following features:
a single leadframe arranged to conduct electrical power to the first LED component and the second LED component;
a single reflector arranged to reflect at least a portion of light emanating from each of the first LED component and the second LED component;
a single submount supporting the first LED component and the second LED component; and
a single lens arranged to transmit at least a portion of light emanating from each of the first LED component and the second LED component.

42. A light emitting apparatus comprising:
a first LED component arranged to generate a first spectral output including a first ratio of scotopic to photopic light (first S/P ratio);
a second LED component arranged to generate a second spectral output including a second ratio of scotopic to photopic light (second S/P ratio), wherein the first S/P ratio is at least 20% greater than the second S/P ratio; and
at least one control circuit arranged to independently supply current to the first LED component and the second LED component;
wherein the light emitting apparatus comprises at least one of the following features (i) and (ii):
(i) the light emitting apparatus is adapted to increase relative spectral output in a wavelength range below 507 nm when the light emitting apparatus is operated at an aggregated emissive output of less than 50% of maximum aggregated emissive output of the light emitting apparatus, in comparison to relative spectral output in a wavelength range below 507 nm when the light emitting apparatus is operated at maximum aggregated emissive output; and
(ii) the light emitting apparatus is adapted to increase correlated color temperature of aggregated emissions by at least about 200K when the light emitting apparatus is operated at an aggregated emissive output of less than 50% of maximum aggregated emissive output, relative to correlated color temperature of aggregated emissions at maximum aggregated emissive output.

43. A light emitting apparatus according to claim 42, being adapted to increase relative spectral output in a wavelength range below 507 nm when the light emitting apparatus is operated at an aggregated emissive output of less than 50% of maximum aggregated emissive output of the light emitting apparatus, in comparison to relative spectral output in a wavelength range below 507 nm when the light emitting apparatus is operated at maximum aggregated emissive output.

44. A light emitting apparatus according to claim 43, wherein relative spectral output in a wavelength range below 507 nm is increased by at least about 20% when the light emitting apparatus is operated at an aggregated emissive output of less than 50% of maximum aggregated emissive output of the light emitting apparatus, in comparison to relative spectral output in a wavelength range below 507 nm when the light emitting apparatus is operated at maximum aggregated emissive output.

45. A light emitting apparatus according to claim 42, being adapted to increase correlated color temperature of aggregated emissions by at least about 200K when the light emitting apparatus is operated at an aggregated emissive output of less than 50% of maximum aggregated emissive output, relative to correlated color temperature of aggregated emissions at maximum aggregated emissive output.

46. A light emitting apparatus according to claim 42, wherein the first LED component includes a first chromaticity, the second LED component includes a second chromaticity, and the first chromaticity and the second chromaticity differ by no more than seven MacAdam ellipses.

* * * * *